(12) United States Patent
Tan et al.

(10) Patent No.: US 11,309,138 B2
(45) Date of Patent: Apr. 19, 2022

(54) CONTACT PASSIVATION FOR PEROVSKITE OPTOELECTRONICS

(71) Applicant: THE GOVERNING COUNCIL OF THE UNIVERSITY OF TORONTO, Toronto (CA)

(72) Inventors: Hairen Tan, Toronto (CA); Xinzheng Lan, Chicago, IL (US); Zhenyu Yang, Toronto (CA); Sjoerd Hoogland, Toronto (CA); Edward Sargent, Toronto (CA)

(73) Assignee: THE GOVERNING COUNCIL OF THE UNIVERSITY OF TORONTO, Toronto (CA)

( * ) Notice: Subject to any disclaimer, the term of this patent is extended or adjusted under 35 U.S.C. 154(b) by 491 days.

(21) Appl. No.: 15/883,992

(22) Filed: Jan. 30, 2018

(65) Prior Publication Data

US 2018/0218845 A1 Aug. 2, 2018

Related U.S. Application Data

(60) Provisional application No. 62/451,938, filed on Jan. 30, 2017.

(51) Int. Cl.
*H01L 51/42* (2006.01)
*H01G 9/20* (2006.01)
(Continued)

(52) U.S. Cl.
CPC ......... *H01G 9/2018* (2013.01); *H01G 9/0029* (2013.01); *H01G 9/2072* (2013.01);
(Continued)

(58) Field of Classification Search
None
See application file for complete search history.

(56) References Cited

U.S. PATENT DOCUMENTS

| 2009/0071533 A1* | 3/2009 | Choi | B82Y 20/00 |
| | | | 136/252 |
| 2015/0122314 A1* | 5/2015 | Snaith | H01L 51/4213 |
| | | | 136/255 |

(Continued)

FOREIGN PATENT DOCUMENTS

| WO | 2014202965 A1 | 12/2014 | |
| WO | WO-2016021900 A1 * | 2/2016 | ......... H01L 51/4226 |

OTHER PUBLICATIONS

English translation of Jeon Nam Joong, WO2016021900-A1.*
(Continued)

*Primary Examiner* — Niki Bakhtiari
(74) *Attorney, Agent, or Firm* — Hill & Schumacher

(57) ABSTRACT

Disclosed herein are perovskite based optoelectronic devices made entirely via solution-processing at low temperatures (<150° C.) which provide for simple manufacturing, compatibility with flexible substrates, and perovskite-based tandem devices. These perovskite based optoelectronic devices are produced using an electron transport layer on which the perovskite layer is formed which is passivated using a ligand selected to reduce electron-hole recombination at the interface between the electron transport layer and the perovskite layer.

20 Claims, 17 Drawing Sheets

(51) Int. Cl.
- *H01L 51/00* (2006.01)
- *H01G 9/00* (2006.01)
- *H01L 51/44* (2006.01)
- *H01L 27/30* (2006.01)

(52) U.S. Cl.
CPC ......... *H01G 9/2077* (2013.01); *H01G 9/2095* (2013.01); *H01L 51/0003* (2013.01); *H01L 51/0007* (2013.01); *H01L 51/4226* (2013.01); *H01L 51/4253* (2013.01); *H01L 51/442* (2013.01); *H01L 51/448* (2013.01); *H01L 27/302* (2013.01); *H01L 51/0077* (2013.01); *H01L 51/0097* (2013.01); *Y02E 10/549* (2013.01)

(56) References Cited

U.S. PATENT DOCUMENTS

| | | |
|---|---|---|
| 2016/0218307 A1 | 7/2016 | Huang et al. |
| 2016/0380125 A1 | 12/2016 | Snaith et al. |
| 2017/0005296 A1 | 1/2017 | Soci et al. |

OTHER PUBLICATIONS

Kojima et al., (Organometal Halide Perovskites as Visible-Light Sensitizers for Photovoltaic cells), 2008.*

International Search Report for related international application No. PCT/CA2018/050109, dated May 28, 2018.

M. Niederberger, M. H. Bartl, G. D. Stucky. Benzyl Alcohol and Titanium TetrachlorideA Versatile Reaction System for the Nonaqueous and Low-Temperature Preparation of Crystalline and Luminescent Titania Nanoparticles. Chem. Mater. 14, 4364-4370 (2002).

J. Wang, J. Polleux, J. Lim, B. Dunn. Pseudocapacitive Contributions to Electrochemical Energy Storage in TiO2 (Anatase) Nanoparticles. J. Phys. Chem. C. 111, 14925-14931 (2007).

H. Zhou, Q. Chen, G. Li, S. Luo, T. Song, H. Duan, Z. Hong, J. You, Y. Liu, Y. Yang. Interface engineering of highly efficient perovskite solar cells. Science 345, 542-546 (2014).

K. Wojciechowski, M. Saliba, T. Leijtens, A. Abate, H. J. Snaith. Sub-150 ° C. processed meso-superstructured perovskite solar cells with enhanced efficiency. Energy Environ. Sci. 7, 1142-1147 (2014).

M. Saliba, T. Matsui, J. Seo, K. Domanski, J. Correa-Baena, M. Nazeeruddin, S. Zakeeruddin, W. Tress, A. Abate, A. Hagfeldt, M. Graetzel. Cesium-containing triple cation perovskite solar cells: improved stability, reproducibility and high efficiency. Energy Environ. Sci. 9, 1989-1997 (2016).

Lijian Zuo et al, "Enhanced Photovoltaic Performance of CH 3 NH 3 Pbl 3 Perovskite Solar Cells through Interfacial Engineering Using Self-Assembling Monolayer", Journal of the American Chemical Society, vol. 137, No. 7, Feb. 13, 2015; pp. 2674-2679.

Yaowen Li et al, "Multifunctional Fullerene Derivative for Interface Engineering in Perovskite Solar Cells", J. Am. Chem. Soc. 2015, 137 pp. 15540-15547, Nov. 23, 2015.

Yuhei Ogomi et al, "All-Solid Perovskite Solar Cells with HOCO-R-NH 3 + I—Anchor-Group Inserted between Porous Titania and Perovskite", Journal of Physical Chemistry C, vol. 118, No. 30, May 21, 2014, pp. 16651-16659.

Edoardo Mosconi et al, "First-Principles Investigation of the TiO 2 /Organohalide Perovskites Interface: The Role of Interfacial Chlorine", Journal of Physical Chemistry Letters, vol. 5, No. 15, Jul. 22, 2014, pp. 2619-2625.

Kyung Taek Cho et al, "Highly efficient perovskite solar cells with a compositionally engineered perovskite/hole transporting material interface", Energy & Environmental Science, vol. 10, No. 2, Jan. 1, 2017, pp. 621-627.

* cited by examiner

| Formation Energy | Chlorinated interface | | Non-chlorinated interface | |
|---|---|---|---|---|
| | MACl-terminated | PbCl$_2$-terminated | MAI-terminated | PbI$_2$-terminated |
| Interface (eV/nm$^2$) | -4.1 | -6.0 | -3.2 | -4.5 |
| Vacancy (eV) | 1.3 | 0.9 | 0.7 | 1.1 |
| Antisite (eV) | - | 3.2 | - | 1.5 |

Figure 1

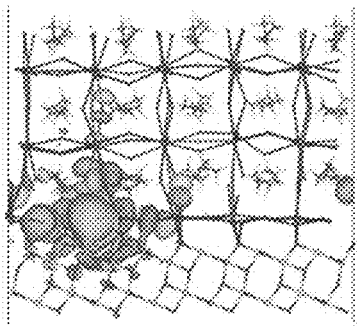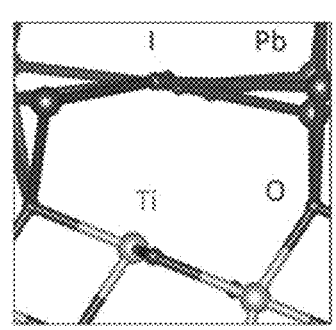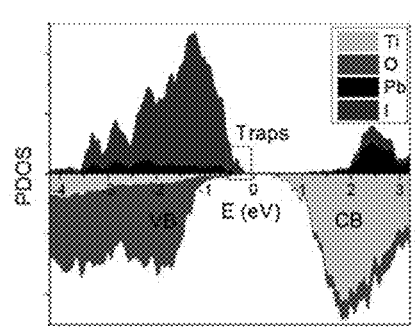
Figure 2A　　　　Figure 2B　　　　Figure 2C
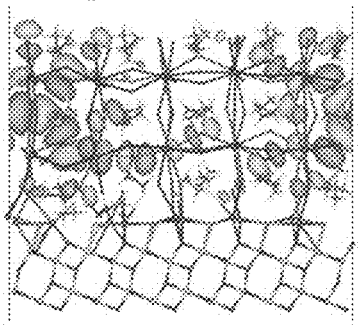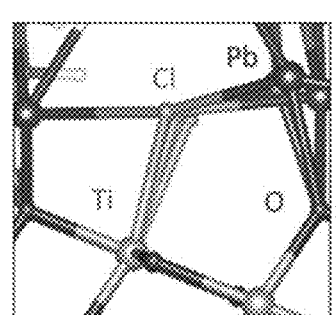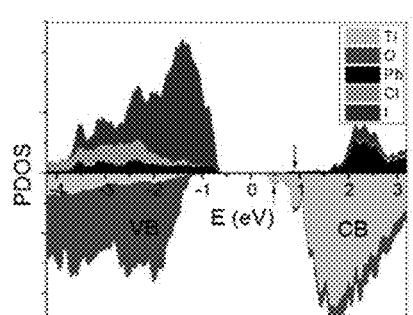
Figure 2D　　　　Figure 2E　　　　Figure 2F

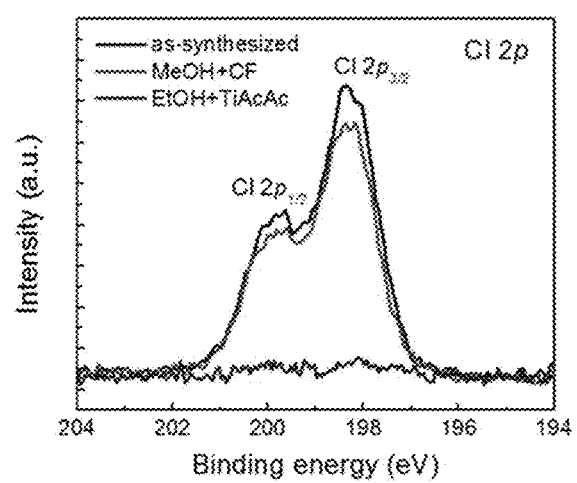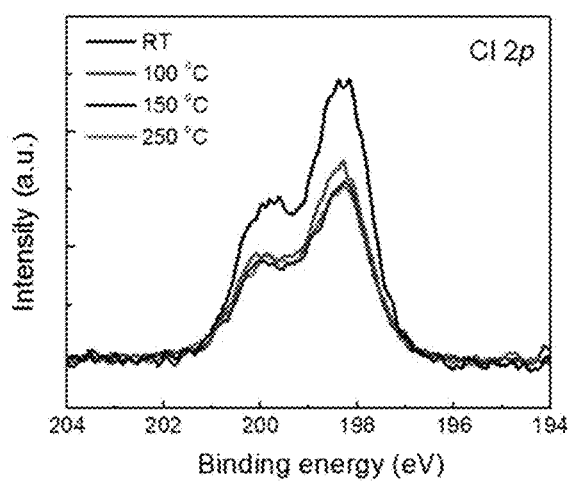
Figure 4A                    Figure 4B

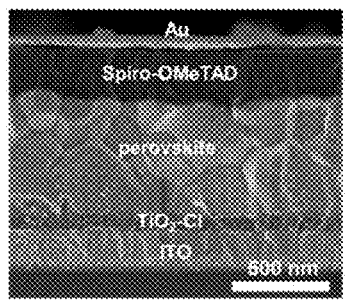
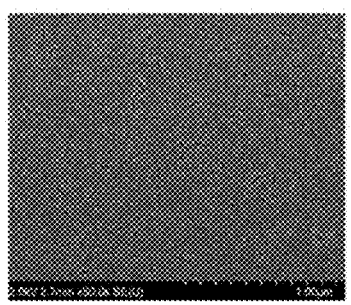
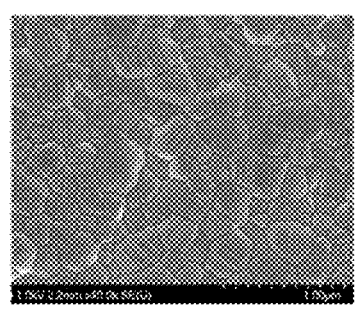
Figure 5A              Figure 5B              Figure 5C
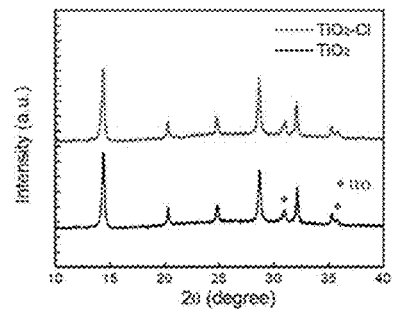
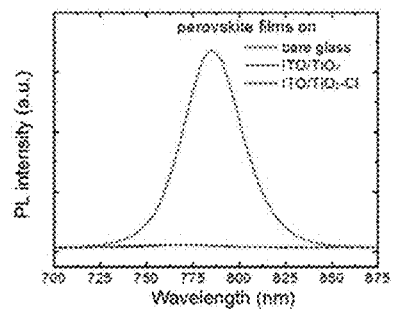
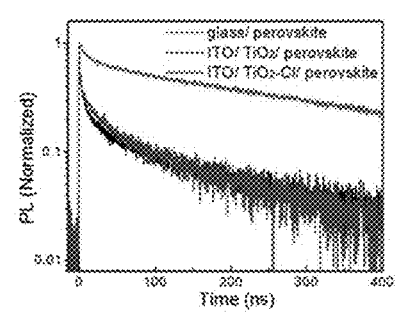
Figure 5D              Figure 5E              Figure 5F

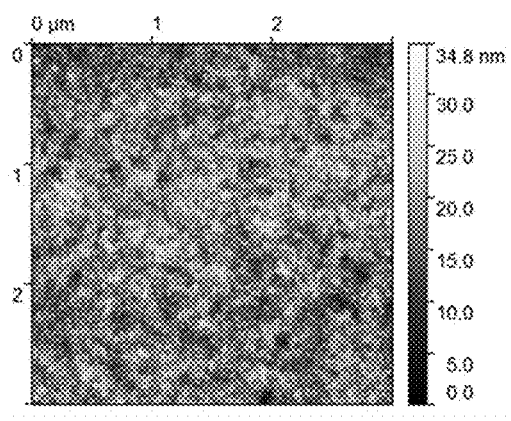 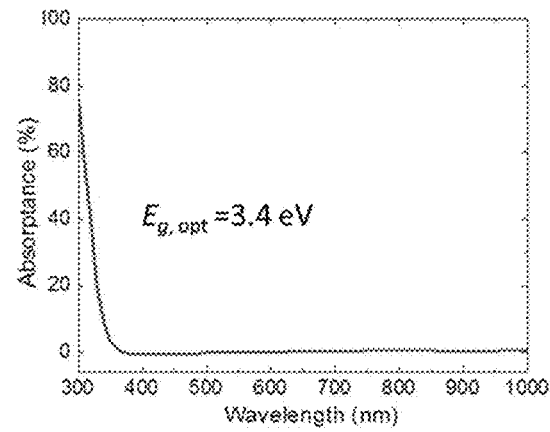
Figure 6A                Figure 6B
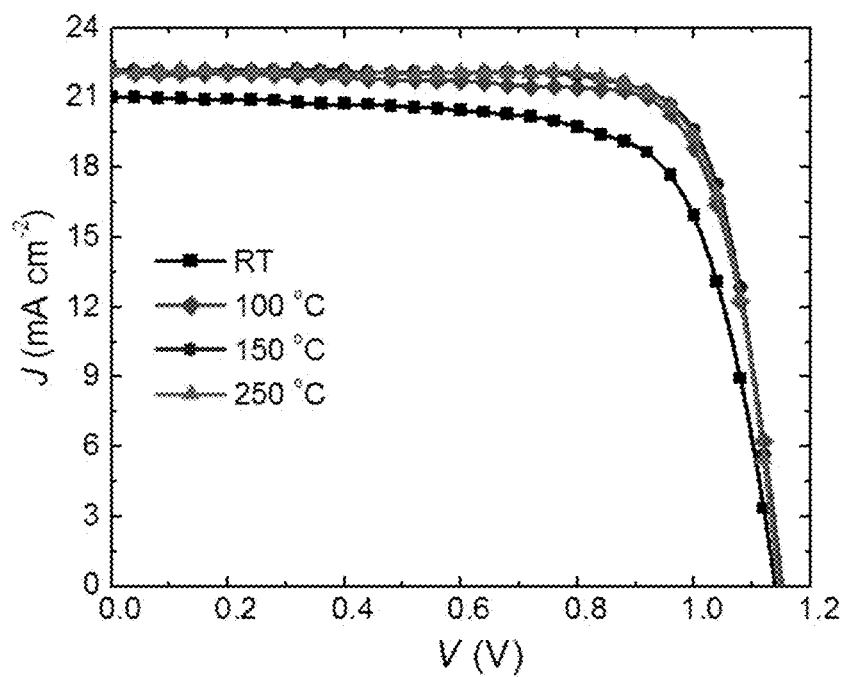
Figure 7

| substrate | τ₁ (ns) | τ₂ (ns) |
|---|---|---|
| Bare glass | 19.9 | 468 |
| glass /ITO/TiO₂ | 0.9 | 112 |
| glass /ITO/TiO₂-Cl | 1.2 | 99 |

| ETL | Scan direction | $V_{oc}$ (V) | $J_{sc}$ (mA/cm$^2$) | FF (-) | PCE (%) |
|---|---|---|---|---|---|
| TiO$_2$ | Reverse | 1.129 | 21.6 | 0.760 | 18.5 |
| | Forward | 1.105 | 21.5 | 0.590 | 14.0 |
| TiO$_2$-Cl | Reverse | 1.151 | 23.0 | 0.789 | 20.9 |
| | Forward | 1.152 | 23.0 | 0.788 | 20.9 |
| 500°C compact TiO$_2$ | Reverse | 1.062 | 21.7 | 0.694 | 16.4 |
| | Forward | 1.077 | 21.5 | 0.607 | 14.1 |
| TiO$_2$/TiO$_2$-Cl | Reverse | 1.131 | 22.9 | 0.803 | 20.8 |
| | Forward | 1.130 | 22.7 | 0.801 | 20.6 |
| Recycled TiO$_2$-Cl | Reverse | 1.115 | 21.7 | 0.748 | 18.1 |
| | Forward | 1.112 | 21.7 | 0.511 | 12.3 |

Figure 16

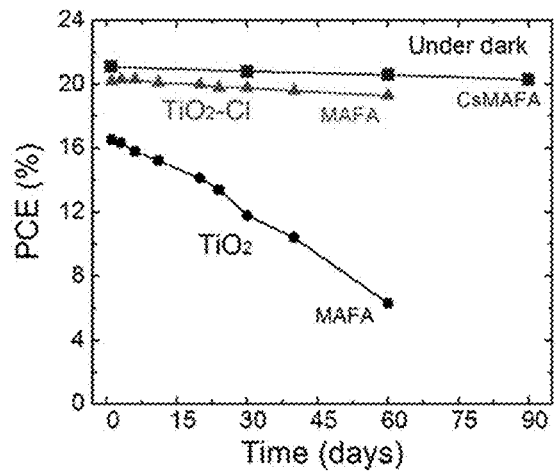
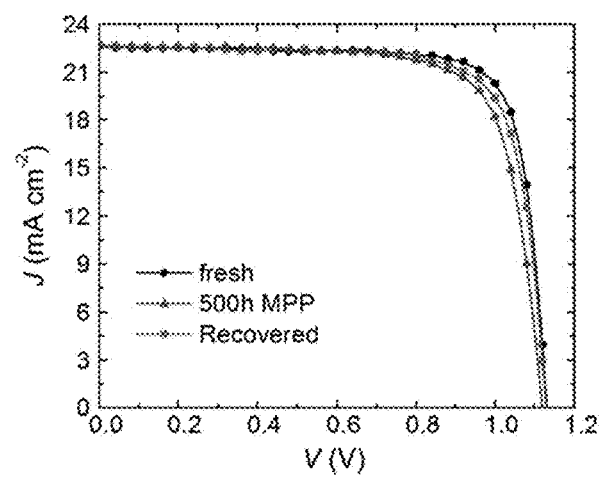
Figure 20A
Figure 20C
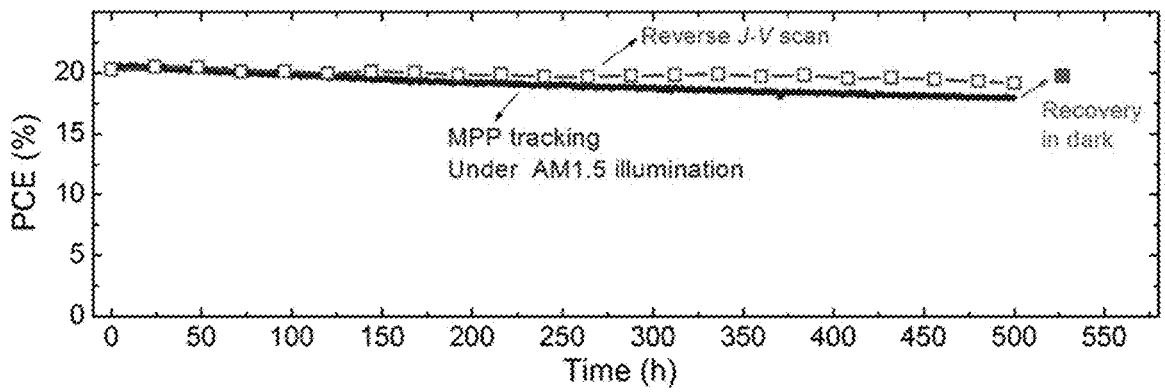
Figure 20B

CONTACT PASSIVATION FOR PEROVSKITE OPTOELECTRONICS

FIELD

The present disclosure relates to perovskite optoelectronic devices in which the interface or junction between the light absorbing perovskite layer and the electron transport layer is passivated giving more efficient and stable performance of the optoelectronic device.

BACKGROUND

Metal halide perovskite solar cells (PSCs) have attracted extensive research interest for next-generation solution-processed photovoltaic (PV) devices because of their high solar-to-electric power conversion efficiency (PCE) and low fabrication cost. The top-performing PSCs, which have reached a certified PCE of 22.1%, have relied on high-temperature-sintered (450° C. to 550° C.) mesoporous $TiO_2$ as electron transport layer (ETL). However, this high-temperature processing makes manufacture more complex and hampers the development of flexible modules and perovskite-based monolithic tandem devices. To overcome this limitation, researchers have pursued planar PSCs that exploit low-temperature (typically ≤150° C.) solution-processed ETLs. Metal oxide materials such as $TiO_2$, ZnO, $SnO_2$, and $Zn_2SnO_4$ colloidal nanoparticles synthesized at low temperatures have commonly been used as the ETL. Unfortunately, the long-term device operational stability and PCEs of PSCs with low-temperature-processed ETLs have remained far inferior to that of counterpart devices made using high-temperature-processed ETLs. Furthermore, PSCs having both high efficiency and large area, required for industrialization, have yet to be demonstrated in low-temperature planar PSCs.

SUMMARY

Disclosed herein are perovskite based optoelectronic devices made entirely via solution-processing at low temperatures (<150° C.) which provide for simple manufacturing, compatibility with flexible substrates, and perovskite-based tandem devices. These perovskite based optoelectronic devices are produced using an electron transport layer on which the perovskite layer is formed which is passivated using a ligand selected to reduce electron-hole recombination at the interface between the electron transport layer and the perovskite layer.

The present disclosure provides a perovskite-based optoelectronic device, comprising:

a) an optically transparent electrode;
b) a semiconductor electron transport layer on said optically transparent electrode;
c) a light-absorbing perovskite layer formed on said semiconductor electron transport layer;
d) the electron transport layer having a surface located at an interface or junction between the electron transport layer and the light-absorbing perovskite layer at least partially capped with a ligand Z, wherein said ligand Z is selected to passivate surface states at said interface or junction between the semiconductor electron transport layer and the light-absorbing perovskite layer; and
e) a hole transport layer on said light-absorbing perovskite layer, and including an electrode layer located on said hole transport layer.

The ligand Z may be any one of a halide, a pseudo halide, a monovalent ammonium cation, and any combination thereof.

The halide may be any one of Cl, Br, I, F, and any combination thereof.

The pseudo halide may be a polyatomic analogue of halide ions. These pseudo halide may be any one of cyanide (CN), thiocyanate (SCN), cyanate (OCN), and any combination thereof.

The monovalent ammonium cation may be any one of positively charged polyatomic ions with the chemical formula of $R^1R^2R^3R^4N^+$; where $R^1$, $R^2$, $R^3$, $R^4$ are selected from a group consisting of hydrogen, and compounds derived from linear alkanes, branched alkanes, cycloalkanes, (poly)cycloalkanes, cis- and trans-linear alkenes, cis- and trans-branched alkenes, linear alkynes, branched alkynes, (poly)alkynes, aromatic hydrocarbons, (poly)aromatic hydrocarbons, heteroarenes, (poly)heteroarenes, thiophenes, (poly)thiophenes, (poly)anilines, and combination of above mentioned elements.

The semiconductor electron transport layer may be any one of doped or undoped $TiO_2$, $SnO_2$, $Al_2O_3$, $Ga_2O_3$, ZnO, $Zn_2SnO_4$, $BaSnO_3$, $BaTiO_3$, $Nb_2O_5$, $Ta_2O_5$ and $ZrO_2$.

The semiconductor electron transport layer may be planar or mesoporous.

The electron transport layer may comprise a single layer or multi-layers.

The optically transparent electrode may be any one of indium doped tin oxide (ITO, $In_2O_3$:$SnO_2$), fluorine doped tin oxide (FTO, $SnO_2$:F), aluminum-doped zinc oxide (AZO), gallium-doped zinc oxide (GZO), boron-doped zinc oxide (BZO) and indium-doped zinc oxide (IZO).

The optically transparent electrode may be a film comprised of any one of silver nanowires, silver nanoparticles, carbon black, carbon nanotube, carbon nanowire, graphene, reduced graphene oxide and ultrathin graphite.

The hole transport layer may be an organic hole transport material or an inorganic hole transport material. When it is an inorganic hole transport material it may be any one of doped or undoped $NiO_x$, $WO_x$, $MoO_x$, CuSCN, $V_2O_5$, $MoS_2$, $CuGaO_2$, PbS and any combination thereof. When it is an organic hole transport material it may be any one of doped or undoped Spiro-OMeTAD (N2,N2,N2',N2',N7,N7,N7', N7'-octakis(4-methoxyphenyl)-9,9'-spirobi[9H-fluorene]-2, 2',7,7'-tetramine), PTAA (Poly[bis(4-phenyl)(2,4,6-trimethylphenyl)amine], P3HT (Poly(3-hexylthiophene-2,5-diyl)), Poly-TPD (Poly(N,N'-bis-4-butylphenyl-N,N'-bisphenyl) benzidine) and PEDOT:PSS (poly(3,4-ethylenedioxythiophene) polystyrene sulfonate).

The perovskite has a general formula of $ABX_3$, where A is a monovalent cation or ion combination, wherein the monovalent cation is $K^+$, $Rb^{30}$, $Cs^+$, or any of organic monovalent cations with the general formula of $R^1R^2R^3R^4N^+$; where R is selected from a group consisting of hydrogen, and compounds derived from linear alkanes, branched alkanes, cycloalkanes, (poly)cycloalkanes, cis- and trans-linear alkenes, cis- and trans-branched alkenes, linear alkynes, branched alkynes, (poly)alkynes, aromatic hydrocarbons, (poly)aromatic hydrocarbons, heteroarenes, (poly)heteroarenes, thiophenes, (poly)thiophenes, (poly)anilines; B is a divalent metal ion or ion combination, wherein the divalent cation is any of $Pb^{2+}$, $Sn^{2+}$, $Cu^{2+}$, $Ge^{2+}$, $Zn^{2+}$, $Ni^{2+}$, $Fe^{2+}$, $Mn^{2+}$, $Eu^{2+}$, and $Co^{2+}$; and any combination thereof; and X is any one of a halide, a pseudo halide, and any combination thereof. The halide may be any one or combination of Cl⁻, Br⁻, I⁻ and F. The pseudo halide may be any one or combination of cyanide (CN), thiocyanate (SCN) and cyanate (OCN).

The electron transport layer having the surface located at the interface or junction between the electron transport layer and the light-absorbing perovskite layer may be substantially fully capped by the ligand Z.

The perovskite-based optoelectronic device may include the electron transport layer being formed from $TiO_2$ nanocrystals, the ligand may be Cl⁻, and the perovskite may be $MA_{0.15}FA_{0.85}PbI_{2.55}Br_{0.45}$, wherein MA is methylammonium cation and FA is formamidinium cation.

The electron transport layer may have a thickness in a range from about 5 nm to about 300 nm, the hole transport layer may have a thickness in a range from about 10 nm to about 300 nm, and the light absorbing perovskite layer may have thickness in a range from about 20 nm to about 2000 nm.

A further understanding of the functional and advantageous aspects of the disclosure can be realized by reference to the following detailed description and drawings.

BRIEF DESCRIPTION OF THE DRAWINGS

Embodiments will now be described, by way of example only, with reference to the drawings, in which:

FIG. 1 is a table shows the formation energies at the $TiO_2$/perovskite interface: interface binding, vacancy and antisite defects.

FIGS. 2A to 2F show DFT (density function theory) simulations of the effect of Cl on interface quality between perovskite and $TiO_2$.

FIG. 2A shows the trap-like localized antisite defects form near the valence band edge for $PbI_2$-terminated $TiO_2$/perovskite interface.

FIG. 2B shows the zoom-in on the $PbI_2$-terminated $TiO_2$/perovskite interface geometry.

FIG. 2C shows the projected density of states that show the formation of trap states in the case of $PbI_2$-termination.

FIG. 2D shows that shallow and delocalized Pb—Cl antisite defects are seen for the $PbCl_2$-terminated $TiO_2$/perovskite interface.

FIG. 2E shows the zoom-in on the $PbCl_2$-terminated $TiO_2$/perovskite interface geometry.

FIG. 2F shows the projected density of states that show the absence of trap states in the case of $PbCl_2$-termination.

FIG. 4A shows XPS (X-ray photoelectron spectroscopy) spectra of Cl 2p peak of $TiO_2$ NC films: as-synthesized, redispersed in the cosolvent of methanol and chloroform (MeOH+CF), redispersed in ethanol with titanium diisopropoxide bis(acetylacetonate) as stabilizer (EtOH+ TiAcAc).

FIG. 4B shows XPS spectra of $TiO_2$—Cl NC films with various post-annealing temperatures: room temperature (RT), 100° C., 150° C., and 250° C.

FIGS. 5A to 5F show device structure and characterization of perovskite films on $TiO_2$—Cl in which:

FIG. 5A shows the device structure and cross-sectional scanning electron microscopy (SEM) image of planar PSC;

FIG. 5B shows a top-view SEM image of the $TiO_2$—Cl film on ITO substrate;

FIG. 5C shows a top-view SEM image of the perovskite film on $TiO_2$—Cl;

FIG. 5D shows XRD patterns of perovskite films on $TiO_2$ and $TiO_2$—Cl; and

FIG. 5E shows steady-state PL (photoluminescence) spectra of perovskite films on bare glass, and on $TiO_2$ and $TiO_2$—Cl coated ITO substrates. The PL signals of perovskite films on $TiO_2$ and $TiO_2$—Cl were effectively quenched by the fast charge extraction by $TiO_2$ and $TiO_2$—Cl.

FIG. 5F shows the time-resolved PL decays of perovskite films on bare glass, and on $TiO_2$ and $TiO_2$—Cl coated ITO substrates.

FIGS. 6A and 6B show the morphology and absorption of $TiO_2$—Cl nanocrystal film on ITO-coated glass substrate, where FIG. 6A shows AFM (atomic force microscopy) height image of $TiO_2$—Cl film deposited on ITO substrate showing a surface roughness of ~4 nm; and FIG. 6B shows absorptance (1-reflection-transmission) of the $TiO_2$—Cl film (on glass) which exhibits high transparency and an optical bandgap of 3.4 eV.

FIG. 7 shows current-voltage (J-V) curves of perovskite solar cells with $TiO_2$—Cl films with various post-annealing temperatures in which the devices showed optimal performance at the annealing temperature of 150° C.

FIG. 9A shows the top-view SEM image of perovskite film on $TiO_2$—Cl; and FIG. 9B shows the cross-sectional SEM images of planar PSCs on $TiO_2$—Cl; and FIG. 9C shows the top-view SEM image of perovskite film on $TiO_2$; and FIG. 9D shows the cross-sectional SEM images of planar PSCs on $TiO_2$.

FIGS. 15A to 15F show enhanced photovoltaic performance of perovskite solar cells with $TiO_2$—Cl, in which:

FIG. 15A shows J-V curves of PSCs with $TiO_2$ and $TiO_2$—Cl as ETLs measured at reverse and forward scans;

FIG. 15B shows histogram of the PCE values among 204 devices on $TiO_2$—Cl;

FIG. 15C shows a plot of normalized transient photocurrent decay;

FIG. 15D shows normalized transient photovoltage decay of solar cells with $TiO_2$ and $TiO_2$—Cl as ETLs; devices shown in FIGS. 15A to 15D have perovskite composition of MAFA;

FIG. 15E shows J-V curves of best-performing small-area (0.049 cm$^2$) CsMAFA PSC measured at reverse and forward scans; and FIG. 15F shows J-V curves of best-performing large-area (1.1 cm$^2$) CsMAFA PSC showing a PCE of 20.3% ($V_{oc}$=1.196 V, $J_{sc}$=22.2 mA cm$^{-2}$, FF=76.4%) at reverse scan. The inset shows the photo of the large-area device. MAFA and CsMAFA denote the perovskite compositions of $FA_{0.85}MA_{0.15}PbI_{2.55}Br_{0.45}$ and $Cs_{0.05}FA_{0.81}MA_{0.14}PbI_{2.55}Br_{0.45}$, respectively.

FIG. 16 is a table showing photovoltaic performance of perovskites on various types of $TiO_2$ based ETLs with respect to reverse and forward scans. $TiO_2$ and $TiO_2$—Cl represent the low-temperature processed $TiO_2$ nanocrystal films without and with Cl-ligands, respectively. Compact $TiO_2$ represents the $TiO_2$ ETL processed at 500° C. which is commonly used as the compact layer in mesoporous $TiO_2$ based perovskite solar cells. $TiO_2$/$TiO_2$—Cl represents one layer of $TiO_2$—Cl on another layer of Cl-free $TiO_2$, where $TiO_2$—Cl contacts with perovskite film in the solar cell. Recycled $TiO_2$—Cl presents the $TiO_2$—Cl film washed with DMSO after perovskite film deposition; it equals to untreated $TiO_2$—Cl film without Cl-ligands on the film surface but still retaining Cl-ligands in the bulk film.

FIG. 20A to 20C show the long-term device stability of perovskite solar cells with $TiO_2$—Cl and $TiO_2$, in which:

FIG. 20A shows the dark storage stability of non-encapsulated PSCs using $TiO_2$ and $TiO_2$—Cl. The unsealed cells were kept in a dry cabinet (<30% relative humidity) in the dark and measured regularly in nitrogen. PCE values were obtained from the reverse scans. MAFA and CsMAFA represent the perovskite compositions of $FA_{0.85}MA_{0.15}PbI_{2.55}Br_{0.45}$ and $Cs_{0.05}FA_{0.81}MA_{0.14}PbI_{2.55}Br_{0.45}$, respectively.

FIG. 20B shows the continuous maximum power point (MPP) tracking for 500 hours of a high-performance unsealed CsMAFA cell with $TiO_2$—Cl in nitrogen atmosphere under constant simulated solar illumination (100 mW cm$^{-2}$) with a 420 nm cutoff UV filter. PCE values taken from reverse current-voltage J-V scans (square symbols) are shown as well; the device retains 95% of initial performance as determined from reverse J-V scans.

FIG. 20C shows the current-voltage (J-V) curves of PSC (CsMAFA) shown in FIG. 20B at various stages: fresh, right after 500 hours of MPP operation, and after recovery overnight in the dark. The J-V curves were measured without UV-filter.

DETAILED DESCRIPTION

Figure 3A:
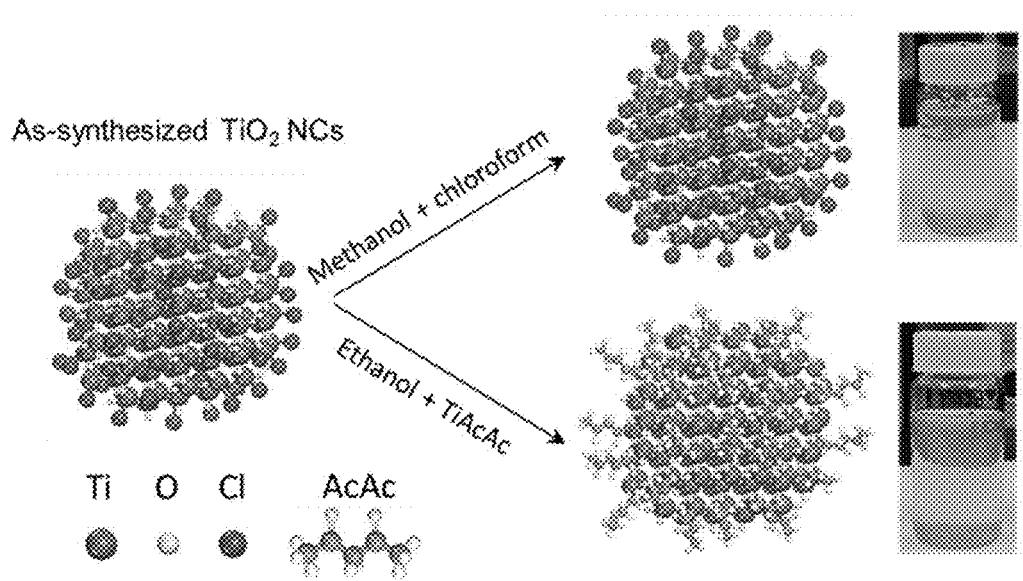
FIG. 3A shows the synthesis and stabilization of Cl-capped $TiO_2$ ($TiO_2$—Cl) colloidal nanocrystals in which $TiO_2$—Cl nanocrystals were obtained by dispersing the as-synthesized NCs in the cosolvent system methanol and chloroform. The controls, $TiO_2$ without Cl-ligands, were dispersed in ethanol with titanium diisopropoxide bis(acetylacetonate) (TiAcAc) as the stabilizer, where the Cl-ligands were exchanged by acetylacetonate (AcAc) ligands.

Various embodiments and aspects of the disclosure will be described with reference to details discussed below. The following description and drawings are illustrative of the disclosure and are not to be construed as limiting the disclosure. Numerous specific details are described to provide a thorough understanding of various embodiments of the present disclosure. However, in certain instances, well-known or conventional details are not described in order to provide a concise discussion of embodiments of the present disclosure.

As used herein, the terms "comprises" and "comprising" are to be construed as being inclusive and open ended, and not exclusive. Specifically, when used in the specification and claims, the terms "comprises" and "comprising" and variations thereof mean the specified features, steps or components are included. These terms are not to be interpreted to exclude the presence of other features, steps or components.

As used herein, the term "exemplary" means "serving as an example, instance, or illustration," and should not be construed as preferred or advantageous over other configurations disclosed herein.

As used herein, the terms "about" and "approximately" are meant to cover variations that may exist in the upper and lower limits of the ranges of values, such as variations in properties, parameters, and dimensions.

The inventors reasoned that performance and stability loss in low-temperature planar PSCs could arise from imperfect interfaces and charge recombination between the selective contact at the illumination side and the perovskite film grown on top, since the perovskite active layers themselves have excellent long-term photostability upon addition of formamidinium (FA), Cs, and Br ions. Indeed, once the impressively long photocarrier diffusion lengths in perovskite films are achieved, attention must shift to perfecting the interface. The inventors reasoned that deep trap states present at the perovskite/ETL interface could potentially be addressed by passivating the interface between the charge selective contact and the perovskite absorber.

As used herein, the phrase perovskite-based optoelectronic device refers to any device involving production of electron hole pairs upon absorption of light, including but not limited to solar cells, transistors, photodetectors, and light emitting diodes (LEDs) to mention a few non-limiting examples.

As used herein, the phrase "pseudo halide" refers to polyatomic analogues of halide ions, wherein the pseudo halide is any one of cyanide (CN), thiocyanate (SCN), cyanate (OCN).

As used herein, the phrase "monovalent ammonium cation" refers to positively charged polyatomic ions with the chemical formula of $R^1R^2R^3R^4N^+$; where $R^1$, $R^2$, $R^3$, $R^4$ are selected from a group consisting of hydrogen, and compounds derived from linear alkanes, branched alkanes, cycloalkanes, (poly)cycloalkanes, cis- and trans-linear alkenes, cis- and trans-branched alkenes, linear alkynes, branched alkynes, (poly)alkynes, aromatic hydrocarbons, (poly)aromatic hydrocarbons, heteroarenes, (poly)heteroarenes, thiophenes, (poly)thiophenes, (poly)anilines, and combination of above mentioned elements.

As used herein the phrases "passivation" and "ligand Z is selected to passivate surface states" refers to an approach or function to reduce the interfacial recombination at the ETL/perovskite junction As used herein, "perovskite" refers to a class of compounds having the general formula $ABX_3$, where:
  A is a monovalent cation or ion combination, wherein the monovalent cation is any one of $K^+$, $Rb^+$, $Cs^+$, or any of organic monovalent cations with the general formula of $R^1R^2R^3R^4N^+$; where R is selected from a group consisting of hydrogen, and compounds derived from linear alkanes, branched alkanes, cycloalkanes, (poly)cycloalkanes, cis- and trans-linear alkenes, cis- and trans-branched alkenes, linear alkynes, branched alkynes, (poly)alkynes, aromatic hydrocarbons, (poly)aromatic hydrocarbons, heteroarenes, (poly)heteroarenes, thiophenes, (poly)thiophenes, (poly)anilines;
  B is the divalent metal ion or ion combination, wherein the divalent cation is any of $Pb^{2+}$, $Sn^{2+}$, $Cu^{2+}$, $Ge^{2+}$, $Zn^{2+}$, $Ni^{2+}$, $Fe^{2+}$, $Mn^{2+}$, $Eu^{2+}$, and $Co^{2+}$; and combination of above mentioned elements; and
  X is the halide group or pseudo halide group, wherein the halide group is any one of $Cl^-$, $Br^-$, $I^-$ and $F^-$, or any of the combination of these halide ions.

As used herein, the phrase "semiconductor electron transport layer" refers to a layer of semiconductor that allows electrons to flow across, whereas holes are blocked and cannot go through.

As used herein, the phrase "hole transport layer" refers to a layer of semiconductor that allows hole to flow across, whereas electrons are blocked and cannot go through.

As used herein, the expression "capped with a ligand", such as when the ETL layer is "capped with a ligand Z" means that the surface atoms of the ETL material are chemically bond with atom(s) of the ligand Z.

It is noted that the ETL surface which the perovskite layer is in contact with may be partially or fully capped. The percentage of surface atoms of ETL material that bonds with the ligand Z may be in the range from about 5% to about 100%.

Broadly speaking, the present disclosure provides perovskite-based optoelectronic devices in which the interface between the light absorbing perovskite layer and the electron transport layer is passivated thereby reducing interfacial trap states that reduce photogenerated carrier lifetimes in the perovskite layer. More specifically, there is disclosed a perovskite-based optoelectronic device which includes an optically transparent electrode, a semiconductor electron transport layer located on the optically transparent electrode having a surface capped with a ligand Z, a light-absorbing perovskite layer formed on the surface of the semiconductor electron transport layer capped by the ligand Z. The ligand Z is selected to passivate surface states at a junction or interface between the semiconductor electron transport layer and the light-absorbing perovskite layer. A hole transport layer is located on the light-absorbing perovskite layer and an electrode layer is located on the hole transport layer.

The perovskite has a general formula of $ABX_3$, where
  A is a monovalent cation or cation combination, wherein the monovalent cation is $K^+$, $Rb^+$, $Cs^+$, or any of organic monovalent cations with the general formula of $R^1R^2R^3R^4N^+$; where R is selected from a group consisting of hydrogen, and compounds derived from linear alkanes, branched alkanes, cycloalkanes, (poly)cycloalkanes, cis- and trans-linear alkenes, cis- and trans-branched alkenes, linear alkynes, branched alkynes, (poly)alkynes, aromatic hydrocarbons, (poly)aromatic hydrocarbons, heteroarenes, (poly)heteroarenes, thiophenes, (poly)thiophenes, (poly)anilines.
  B is a divalent metal cation or cation combination, wherein the divalent cation is any of $Pb^{2+}$, $Sn^{2+}$, $Cu^{2+}$, $Ge^{2+}$, $Zn^{2+}$, $Ni^{2+}$, $Fe^{2+}$, $Mn^{2+}$, $Eu^{2+}$, and $Co^{2+}$; and any combination thereof, and
  X is a halide or pseudo halide, wherein the halide group is any one of $Cl^-$, $Br^-$, $I^-$ and $F^-$, or any of the combination of these halide ions.

The ligand Z may be a halide, a pseudo halide, a monovalent ammonium cation, and any of the combination thereof. Thus, the halide may be any one of Cl, Br, I and F, or any of the combination of these halides. Alternatively, the ligand may be a pseudo halide which are polyatomic analogues of halide ions. Examples of pseudo halides include cyanide (CN), thiocyanate (SCN) or cyanate (OCN).

When the ligand Z is a monovalent ammonium cation, the monovalent ammonium cation may be any one of positively charged polyatomic ions with the chemical formula of $R^1R^2R^3R^4N^+$; where $R^1$, $R^2$, $R^3$, $R^4$ consist of hydrogen or compounds derived from linear alkanes, branched alkanes, cycloalkanes, (poly)cycloalkanes, cis- and trans-linear alkenes, cis- and trans-branched alkenes, linear alkynes, branched alkynes, (poly)alkynes, aromatic hydrocarbons, (poly)aromatic hydrocarbons, heteroarenes, (poly)heteroarenes, thiophenes, (poly)thiophenes, (poly)anilines, and combination of above mentioned elements.

The semiconductor electron transport layer is any one of doped or undoped $TiO_2$, $SnO_2$, $Al_2O_3$, $Ga_2O_3$, ZnO, $Zn_2SnO_4$, $BaSnO_3$, $BaTiO_3$, $Nb_2O_5$, $Ta_2O_5$ and $ZrO_2$. The doping may be used to tune the conductivity and/or work function of the semiconductor electron transport layer which could lead to better device performance.

The semiconductor electron transport layer may be planar or mesoporous.

The electron transport layer may comprise a single layer or multi-layers. For example, while a single layer suffices in most cases, in some instances using multilayers may be used to obtain better device performance. A non-limiting example of a multilayer ETL is $TiO_2/SnO_2$ for ETL.

The optically transparent electrode may be any one of indium doped tin oxide (ITO, $In_2O_3:SnO_2$), fluorine doped tin oxide (FTO, $SnO_2:F$), aluminum-doped zinc oxide (AZO), gallium-doped zinc oxide (GZO), boron-doped zinc oxide (BZO), indium-doped zinc oxide (IZO).

Alternatively, the optically transparent electrode may be a film comprised of any one of silver nanowires, silver nanoparticles, carbon black, carbon nanotube, carbon nanowire, graphene, reduced graphene oxide and ultrathin graphite.

The hole transport layer may be an organic hole transport material or an inorganic hole transport material. When it is an inorganic hole transport layer it may be any one of doped or undoped $NiO_x$, $WO_x$, $MoO_x$, CuSCN, $V_2O_5$, $MoS_2$, $CuGaO_2$, PbS and any combination thereof. The doping is used to tune the conductivity and/or work function of the semiconductor electron transport layer which could lead to better device performance.

When it is an organic hole transport material it may be any one of doped or undoped Spiro-OMeTAD (N2,N2,N2',N2', N7,N7,N7',N7'-octakis(4-methoxyphenyl)-9,9'-spirobi[9H-fluorene]-2,2',7,7'-tetramine), PTAA (Poly[bis(4-phenyl)(2, 4,6-trimethylphenyl)amine], P3HT (Poly(3-hexylthiophene-2,5-diyl)), Poly-TPD (Poly(N,N'-bis-4-butylphenyl-N,N'-bisphenyl)benzidine) and PEDOT:PSS (poly(3,4-ethylenedioxythiophene) polystyrene sulfonate). The doping is used to tune the conductivity and/or work function of the semiconductor electron transport layer which could lead to better device performance.

The electron transport layer having the surface located at the interface or junction between the electron transport layer and the light-absorbing perovskite layer may be substantially fully capped by the ligand Z.

The electron transport layer may have a thickness in a range from about 5 nm to about 300 nm, hole transport layer may have a thickness in a range from about 10 nm to about 300 nm, and the light absorbing perovskite layer may have thickness in a range from about 20 nm to about 2000 nm.

A significant advantage of the perovskite based optoelectronic devices producing in accordance with the present disclosure is the use of ligands to passive the interface has two effects, the first is to reduce defect states thereby increasing bulk recombination times of the photogenerated carriers and to increase the stability of the perovskite layer since the ligands appear to bind to both the surface of the electron transport layer and the perovskite layer at the interface between the ETL and the perovskite layer.

The present disclosure will now be illustrated by the following non-limiting example.

Example

Here the inventors disclose a simple and effective interface passivation method that leads to efficient and stable low-temperature-processed planar PSCs. Chlorine-capped $TiO_2$ colloidal nanocrystal (NC) films processed ≤150° C. were used as the ETL. Here we find that the interfacial Cl ligands on the $TiO_2$ NCs suppress deep trap states at the perovskite/$TiO_2$ interface and thus considerably reduce interface recombination at $TiO_2$/perovskite contact. The interfacial Cl ligands also lead to strong electronic coupling and chemical binding at the $TiO_2$/perovskite planar junction. As a result, we fabricated hysteresis-free planar PSCs with independently-certified PCEs of 20.1% for small-area devices (0.049 cm$^2$) and 19.5% for large-area devices (1.1 cm$^2$). The low-temperature planar PSCs with high initial PCE >20% exhibit excellent operational stability and retain 90% (97% after dark recovery) of their initial performance after 500 hours operating at their maximum power point under constant one-sun illumination (1000 W/m$^2$).

The defect passivation and interface binding by interfacial chlorine at the $TiO_2$/perovskite interface were examined using density functional theory (DFT). As shown in FIG. 1, Cl at the interface results in stronger binding at the $TiO_2$/perovskite interface both for the cases of MAX- and $PbX_2$-terminated (X=Cl, I) perovskite surfaces. Perovskite films with the $PbX_2$-terminated interface are energetically favored to contact the $TiO_2$. Previous studies have shown that, in bulk perovskites, the most detrimental defects (deep level defects) are antisites, but that their formation energy is relatively high, explaining the low trap-state density in $MAPbI_3$ perovskite films and single crystals. Vacancies and interstitials, although much more abundant, are shallow defects. We thus explored the effect of Cl at the interface on both antisite and vacancy defects. Without Cl, a Pb—I antisite defect leads to localized states near the valence band edge (FIG. 2A to 2C). They can capture holes and become non-radiative recombination centers. In contrast, the formation energy of the Pb—Cl antisite at the $PbCl_2$-terminated interface is higher (less favorable to form), indicating that antisite defects are suppressed in the presence of interfacial Cl atoms. The Pb—Cl antisite defect becomes much shallower and more delocalized (FIG. 2D to 2F) and has little effect on interface recombination. Overall, the incorporation of Cl atoms at the $TiO_2$/perovskite interface resulted in a lower density of interfacial trap states as well as stronger binding between $TiO_2$ and perovskite (FIG. 1).

Figure 3B:
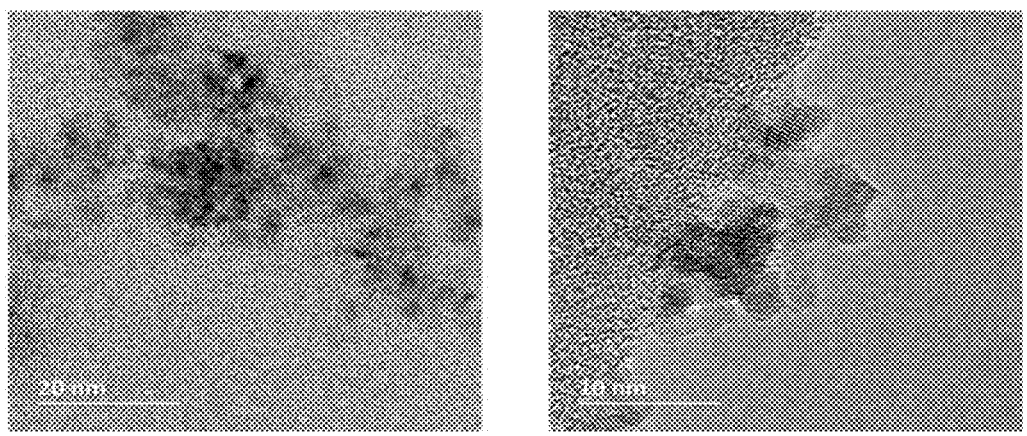
FIG. 3B shows HR-TEM (high-resolution transmission electron microscopy) images of $TiO_2$—Cl nanocrystals. The nanocrystals are crystalline and have a diameter of ~5 nm.

We devised a synthetic approach to obtain Cl-capped $TiO_2$ NCs as the electron transport layer in perovskite solar cells. We first synthesized anatase $TiO_2$ NCs via a nonhydrolytic method through the reaction of $TiCl_4$ and benzyl alcohol under ambient atmosphere (1, 2) (FIG. 3A). The as-synthesized $TiO_2$ NCs have a diameter of ~5 nm (FIG. 3B). Firstly, 4 mL $TiCl_4$ (99.9%, Sigma-Aldrich) was injected drop by drop into 16 mL cold anhydrous ethanol (stored in the fridge before use) with strong stirring to avoid local overheating of ethanol. After the solution cooled down to room temperature, 80 mL of anhydrous benzyl alcohol was added to the previous solution after cooling and stirred for 10 min. The mixed solution was then transferred into a 200-mL vail, which was firmly sealed and stored without stirring in an oven at 85° C. for 12 hours. The product $TiO_2$ nanocrystals were then precipitated from the as-obtained solution by the addition of diethyl ether and isolated by centrifugation at 5000 rpm for 2 min. The solid was subsequently washed by adding anhydrous ethanol and diethyl ether, followed by a similar centrifugation step (5000 rpm for 2 min). This washing procedure was repeated for twice. To obtain the chlorine-capped $TiO_2$ ($TiO_2$—Cl) colloidal solution (~5 mg/mL), the washed $TiO_2$ nanocrystals were dispersed into anhydrous chloroform and anhydrous methanol (1:1 volume ratio). The solution is transparent and can be stable in air for at least 6 months without precipitation. To get non-Cl capped $TiO_2$ ($TiO_2$) colloidal solution, the washed $TiO_2$ nanocrystals were dispersed in anhydrous ethanol (concentration around 6 mg/mL) by the addition of titanium diisopropoxide bis(acetylacetonate) (15 µL/mL). The obtained solution is transparent and shows slight yellow color.

This process results in Cl-capped $TiO_2$ NCs ($TiO_2$—Cl) with 12±2 at. % of Cl relative to Ti atoms as determined using x-ray photoelectron spectroscopy (XPS, FIGS. 4A and 4B). A mixture of methanol and chloroform was used to disperse the NCs while preserving surface Cl-ligands. XPS confirmed that surface Cl-ligands were well-retained after we formed films from a methanol-chloroform cosolvent (FIG. 4A). In contrast, the surface Cl-ligands were detached from TiO$_2$ surfaces when the washed NCs were redispersed in ethanol with a stabilizer such as titanium diisopropoxide bis(acetylacetonate) (TiAcAc) (FIG. 4A). Such TiO$_2$ NCs that lack Cl-ligands—the ETL materials used in previous reports (3, 4)—were taken as controls in the present study. Below, we denote the TiO$_2$ ETL with Cl-ligands as TiO$_2$—Cl; and the TiO$_2$ ETL lacking the Cl-ligands as TiO$_2$. The Cl atoms were strongly bound to TiO$_2$, and the Cl-ligands of TiO$_2$ thin film were retained on the surface after annealing up to 250° C. (FIG. 4B).

PSCs with TiO$_2$ as ETL were fabricated with the device architecture of FIG. 5A. The pre-patterned indium tin oxide (ITO) coated glass was sequentially cleaned using detergent, acetone, and isopropanol. The TiO$_2$—Cl and TiO$_2$ electron transport layers (ETLs) were spin-coated on ITO substrates from the colloidal TiO$_2$ nanocrystal solutions and annealed on a hot plate at the displayed temperature of 150° C. for 30 min in ambient air. The thicknesses of TiO$_2$—Cl and TiO$_2$ ETLs are about 60 and 50 nm, respectively. After the substrates had cooled, the TiO$_2$-coated substrates were transferred immediately to a nitrogen-filled glovebox for the deposition of perovskite films. The FA$_{0.85}$MA$_{0.15}$PbI$_{2.55}$Br$_{0.45}$ precursor solution (1.2 M) was prepared in a mixed solvent of DMF and DMSO with a volume ratio of 4:1. The molar ratios for PbI$_2$/PbBr$_2$ and FAI/MABr were both fixed at 0.85:0.15, and the molar ratio of (FAI+MABr)/(PbI$_2$+PbBr$_2$) was fixed at 1:1. The Cs$_{0.05}$FA$_{0.81}$MA$_{0.14}$PbI$_{2.55}$Br$_{0.45}$ precursor solution (1.2 M) was prepared with molar ratios of PbI$_2$/PbBr$_2$ and FAI/MABr both fixed at 0.85:0.15, molar ratio of CsI/(FAI+MABr)=0.05:0.95, and the molar ratio of (FAI+MABr+CsI)/(PbI$_2$+PbBr$_2$) was fixed at 1:1.

The perovskite films were deposited onto the TiO$_2$ substrates with two-step spin coating procedures. The first step was 2000 rpm for 10 s with an acceleration of 200 rpm/s. The second step was 4000 rpm for 20 s with a ramp-up of 1000 rpm/s. Chlorobenzene (100 μL) was dropped on the spinning substrate during the second spin-coating step at 10 s before the end of the procedure. To form a thick but still smooth perovskite film, chlorobenzene was slowly dropped on the precursor film within ~3 seconds to allow sufficient extraction of extra DMSO through the entire precursor film. The substrate was then immediately transferred on a hotplate and heated at 100° C. for 10 min. After cooling down to room temperature, the hole-transport layer was subsequently deposited on top of the perovskite film by spin coating at 4000 rpm for 30 s using a chlorobenzene solution which contained 65 mg/mL of Spiro-OMeTAD and 20 μL/mL of tert-butylpyridine, as well as 70 μL/mL of bis(trifluoromethane)sulfonimide lithium salt (170 mg/mL in acetonitrile). Finally, 100 nm Au contact was deposited on top of Spiro-OMeTAD by electron-beam evaporation in an Angstrom Engineering deposition system.

Figure 8:
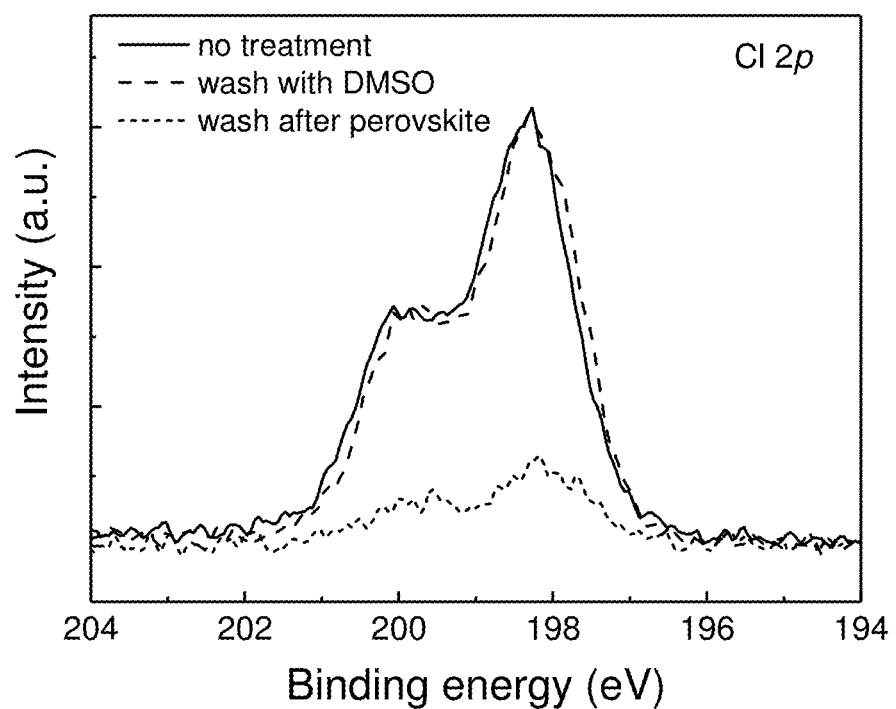
FIG. 8 shows XPS spectra depicting the Cl 2p peak of the $TiO_2$—Cl film without any treatment, washed with DMSO solvent, and washed with DMSO solvent after perovskite film deposition. It clearly shows that the perovskite precursor solvent, e.g. DMSO, could not wash away the Cl-ligands on $TiO_2$ surface. Once the interfacial Cl atoms are incorporated into the perovskite crystal at $TiO_2$—Cl/perovskite interface, the interfacial Cl atoms in the perovskite can be dissolved in DMSO solvent. The weak Cl 2p signal could be from the underlying Cl-ligands (away from the $TiO_2$/perovskite interface, no contact with perovskite film) in the bulk of $TiO_2$—Cl NC film.
Figure 9A:
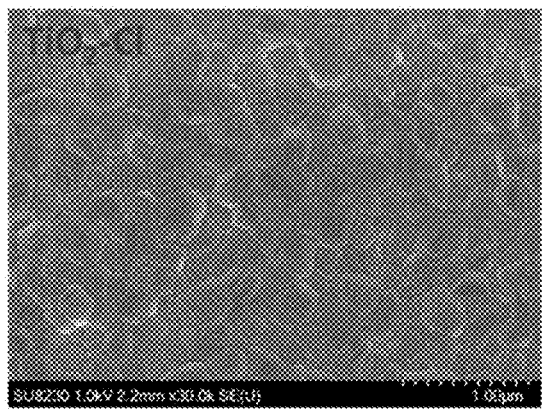
FIGS. 9A to 9D show the top-view SEM images of perovskite films and cross-sectional SEM images of planar PSCs on $TiO_2$—Cl (A-B) and $TiO_2$ (C-D), where
Figure 9B:
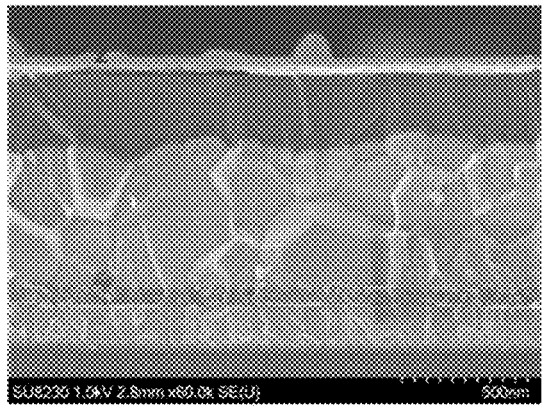
Figure 9C:
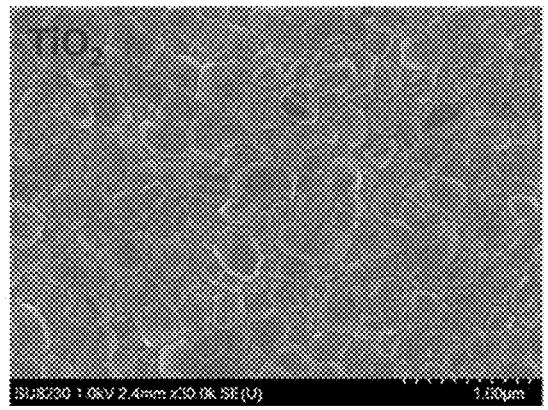
Figure 9D:
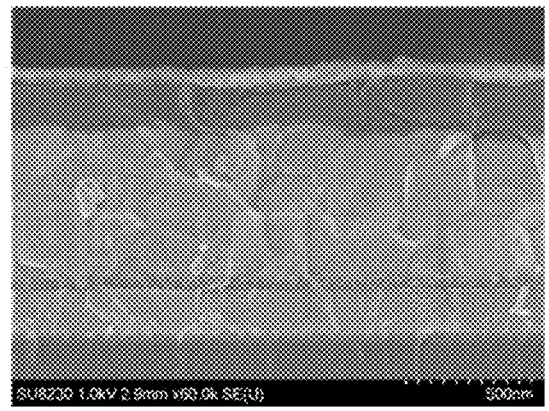

The TiO$_2$—Cl film on ITO-coated glass obtained by spin-coating was smooth and pinhole-free (FIG. 5B, FIG. 6A). The film also exhibited negligible parasitic absorption loss over the entire visible to near-infrared spectral range (FIG. 6B). Post-annealing at moderate temperatures was applied to improve the quality of the spin-cast TiO$_2$—Cl film. The best PV performance was achieved with a TiO$_2$—Cl annealing temperature of 150° C. (FIG. 7). The mixed cation/halide perovskite layer FA$_{0.85}$MA$_{0.15}$PbI$_{2.55}$Br$_{0.45}$, with a thickness of ~600 nm, was deposited on the TiO$_2$—Cl film using the anti-solvent method. The processing solvent for perovskite precursors (e.g. dimethylsulfoxide, DMSO) did not remove surface Cl-ligands from the TiO$_2$—Cl film (FIG. 8).

Figure 10:
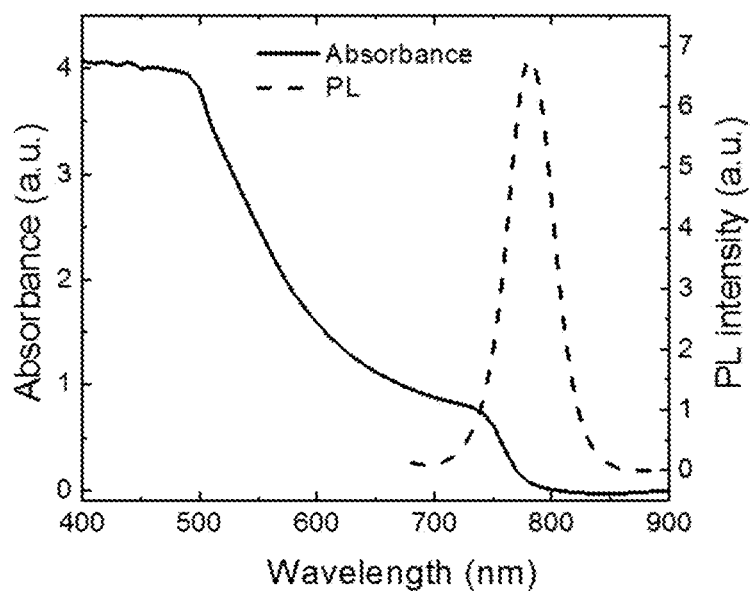
FIG. 10 shows absorbance and PL spectra of perovskite film formed on glass substrate.
Figure 11A:
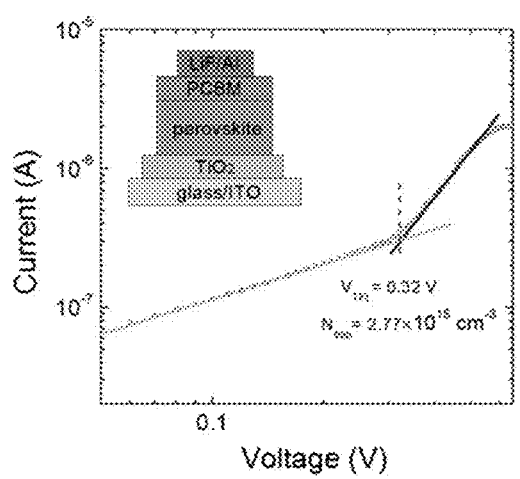
FIG. 11A shows current-voltage traces and trap density of perovskite films on $TiO_2$.
Figure 11B:
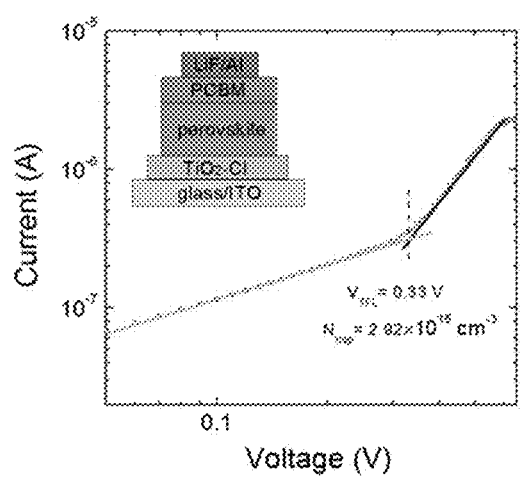
FIG. 11B shows current-voltage traces and trap density of perovskite films on $TiO_2$—Cl as determined by the space-charge-limited current (SCLC) method. The trap density $N_{trap}$ is determined by the equation: $V_{TFL}=eN_{trap}L^2/(2\varepsilon\varepsilon_0)$, where $V_{TFL}$ is trap-filled limit voltage, L is the thickness of perovskite film, $\varepsilon$ is the relative dielectric constant of perovskite, and $\varepsilon_0$ is the vacuum permittivity.
Figures 12, 13:
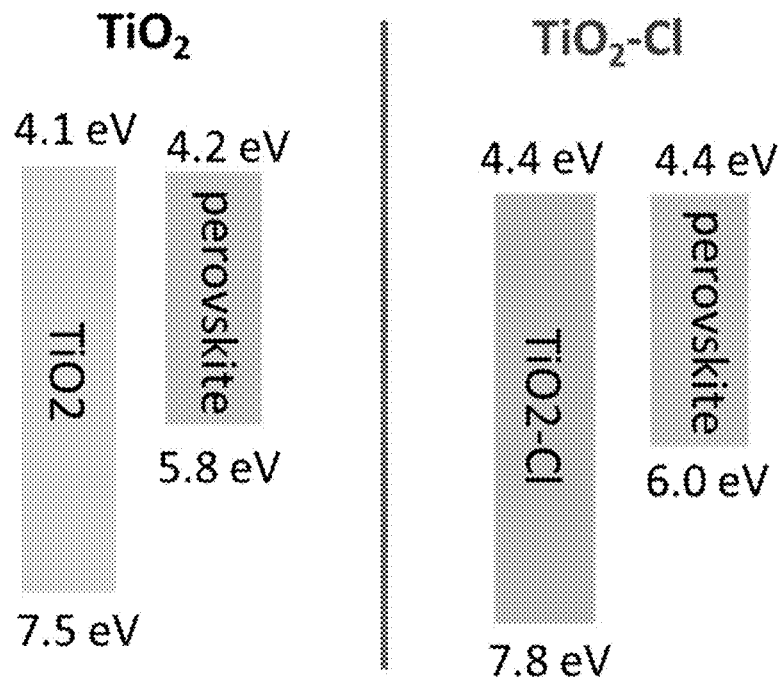
FIG. 12 shows conduction band alignments of $TiO_2$ (left hand side) and $TiO_2$—Cl (right hand side) with the perovskite films grown on top as determined from the UPS (ultraviolet photoelectron spectroscopy) and absorption measurements.
FIG. 13 shows PL (photoluminescence) decay lifetimes of perovskite films on bare glass, $TiO_2$ and $TiO_2$—Cl coated ITO substrates. $\tau_1$ and $\tau_2$ correspond to the fast and slow decay components, respectively.

The bulk quality of perovskite films was similar on both TiO$_2$—Cl and TiO$_2$, a consequence of their identical processing. Smooth pinhole-free perovskite films with uniform and large grains were formed on both TiO$_2$—Cl and TiO$_2$ (FIG. 5C and FIG. 9). As expected from the stoichiometric ratio of the precursors, x-ray diffraction (XRD) spectra show no obvious PbI$_2$ nor other non-perovskite phases in films (FIG. 5D). The sharp absorption edge and narrow PL spectrum of the perovskite film confirm a homogenous and single-phase material (FIG. 10). The perovskite films on both TiO$_2$—Cl and TiO$_2$ exhibit a remarkably low trap state density of ~3×10$^{15}$ cm$^{-3}$ as determined using the space-charge limit current (SCLC) method (FIG. 11). The band alignment between TiO$_2$—Cl (TiO$_2$) and perovskite was determined from ultraviolet photoelectron spectroscopy (UPS) and absorption measurements (FIG. 12). The excellent match in conduction band minimum (CBM) between TiO$_2$—Cl and perovskite allowed efficient electron transfer into TiO$_2$—Cl, while the high offset in valence band maximum (VBM) provided efficient hole blocking.

The charge transfer kinetics between perovskite and ETL were studied using steady-state and time-resolved photoluminescence (TR-PL) spectroscopy. When perovskite films were formed on TiO$_2$ and TiO$_2$—Cl, the steady-state PL was quenched because of fast electron transfer to ETLs (FIG. 5E). FIG. 5F shows the PL decays of the perovskite films on bare glass and on the TiO$_2$ and TiO$_2$—Cl coated ITO glass substrates. FIG. 13 summarizes the decays fit for biexponential components, a fast decay lifetime $\tau_1$, and a slow decay lifetime $\tau_2$. The perovskite film on bare glass showed a long lifetime ($\tau_2$) of 470 ns. The PL lifetimes of perovskite films on ETLs were shortened to a similar degree for both TiO$_2$ and TiO$_2$—Cl. This result indicates that both ETLs had sufficient electron extraction in solar cells, consistent with the good band alignments between the ETLs and perovskite.

Figure 14:
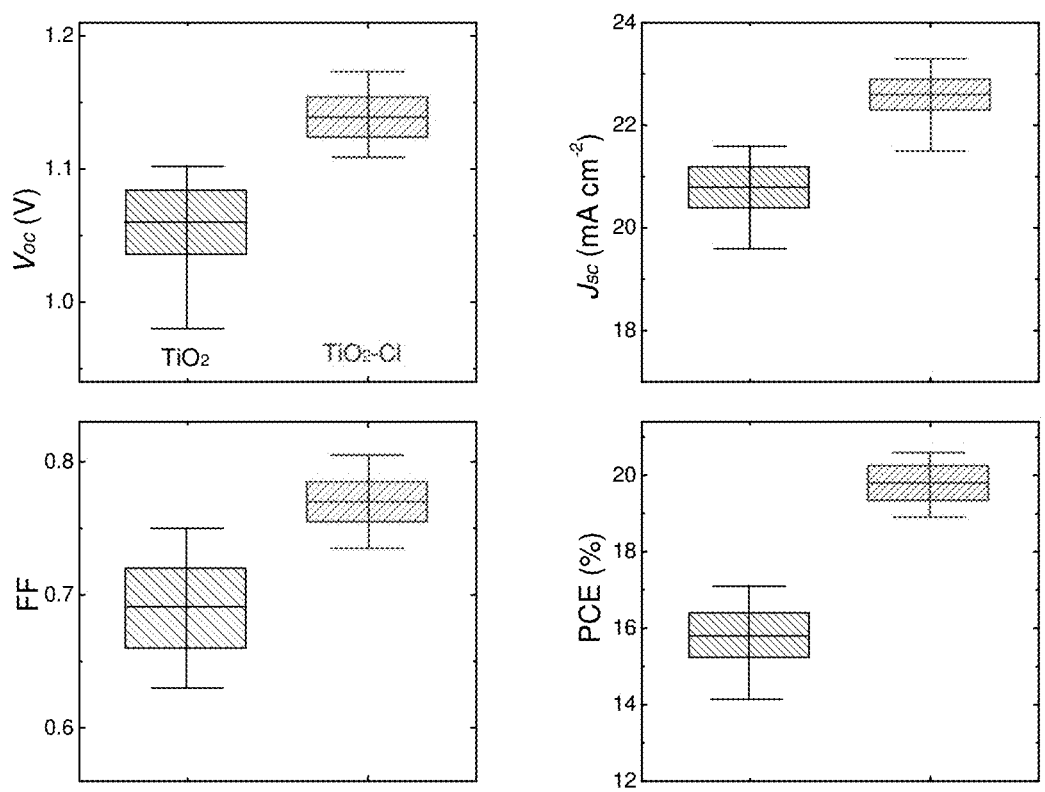
FIG. 14 shows a comparison of the photovoltaic performance of PSCs with $TiO_2$ and $TiO_2$—Cl ETLs. Devices were measured at reverse scan with a delay time of 200 ms and voltage step of 10 mV. Statistics of 40 devices for each ETL are shown. The devices were fabricated at 8 otherwise-identical runs.

To explore the effect of interfacial Cl atoms on the PV performance of planar PSCs, we made devices on the TiO$_2$—Cl and control TiO$_2$ ETLs. FIG. 14 presents the statistical performance of 40 devices fabricated with otherwise-identical device processing on each type of ETL. Solar cells fabricated on TiO$_2$—Cl exhibit considerably better performance than those on TiO$_2$ for all PV metrics: the average V$_{oc}$ increased from 1.06 V to 1.14 V with the incorporation of Cl; and the average FF increased from 69% to 77%. Correspondingly, TiO$_2$—Cl resulted in a higher average PCE (19.8%) than the Cl-free TiO$_2$ (15.8%).

Figure 15A:
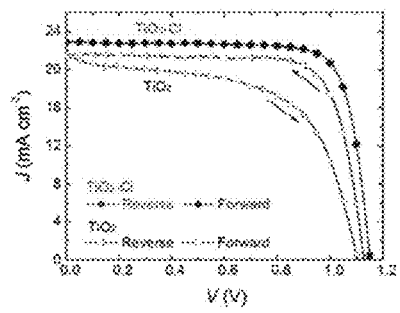
Figure 15B:
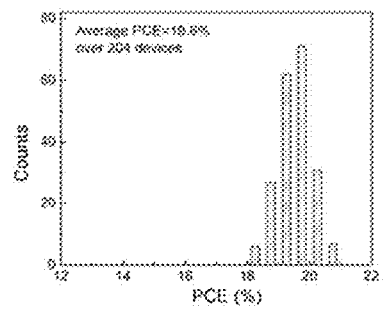
Figure 17:
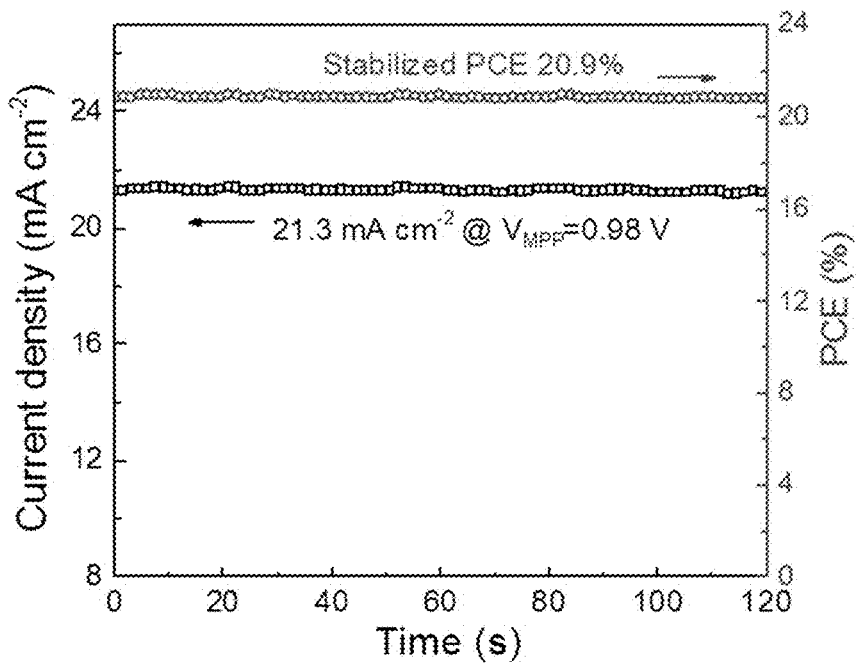
FIG. 17 is a plot showing stabilized maximum power output and the photocurrent density at maximum power point as a function of time for the best performing PSC recorded under simulated one-sun AM1.5G illumination.
Figure 18:
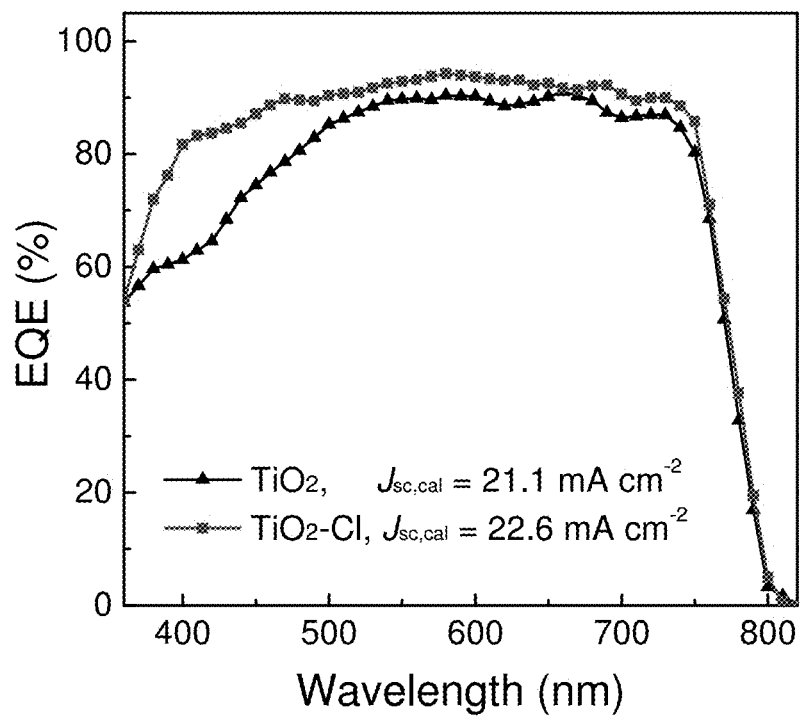
FIG. 18 is a plot showing external quantum efficiency (EQE) spectra of perovskite solar cells (PSCs) with $TiO_2$ and $TiO_2$—Cl electron transport layers (ETLs).

Device performance measured after optimization is shown in FIG. 15A and FIG. 16. These results confirm that the interfacial Cl-atoms, not the bulk properties of TiO$_2$ ETLs, dominate the performance of these perovskite solar cells. FIG. 15B shows a histogram of PCE values over 200 planar PSCs fabricated on TiO$_2$—Cl within a period of 3 months. Excellent reproducibility is indicated by the narrow distribution of PCE values. The best-performing devices with TiO$_2$—Cl reached a PCE of 20.9%. The PCE from J-V sweeps is consistent with the stabilized maximum power output (FIG. 17). The EQE spectrum (FIG. 18) exhibited a broad plateau above 80% over the spectral range from 400 to 760 nm because of strong light harvesting within the thick perovskite film. Integration of the EQE curve with the AM1.5G solar spectrum yielded a photocurrent density of 22.6 mA cm$^{-2}$, in good agreement with the J$_{sc}$ value from J-V characterization. We also examined the hysteresis of solar cells made on TiO$_2$—Cl and TiO$_2$ (FIG. 15A). Devices on TiO$_2$—Cl showed negligible hysteresis, while devices made on TiO$_2$ exhibit strong hysteresis, similar to previous reports using low-temperature TiO$_2$ as ETL (3, 4). The PV parameters of the Cl-free devices varied substantially with respect to scan direction.

Figure 15C:
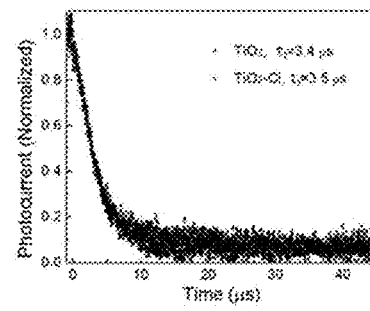

To gain further insight into the performance enhancement resulting from the use of TiO$_2$—Cl, perovskite film properties were characterized, including charge transfer kinetics, and charge recombination in solar cells with TiO$_2$ and TiO$_2$—Cl. The bulk quality of perovskite films and charge transfer were similar on both ETLs. Transient photocurrent decay under short-circuit conditions was obtained to study the influence of the ETL on charge transfer in solar cells (FIG. 15C). Cells with the two ETLs had comparable charge transport lifetime ($\tau_1$~3.4 μs), indicating similar interfacial charge transfer. This similarity indicates that either bulk quality or interface charge transfer is not the main reason for the solar cell performance enhancement by TiO$_2$—Cl.

Figure 15D:
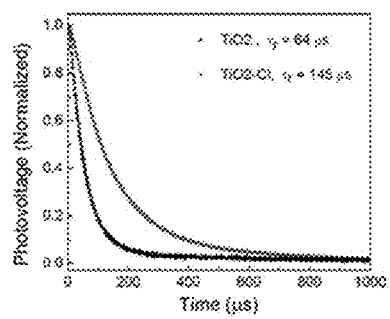
Figure 19:
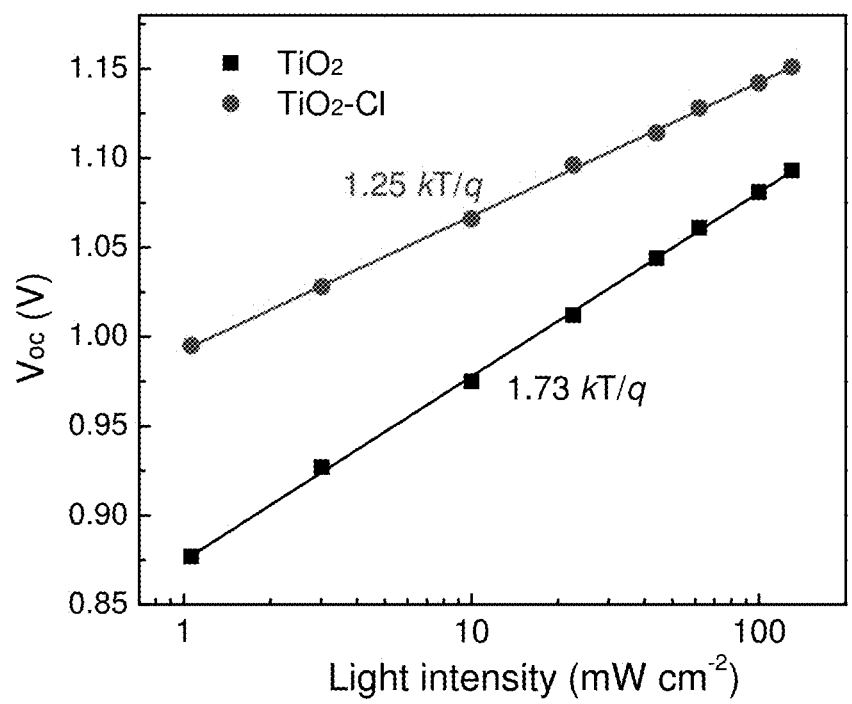
FIG. 19 is a plot of $V_{oc}$ vs. light intensity for planar PSCs with $TiO_2$ and $TiO_2$—Cl ETLs.

Solar cells were characterized using transient photovoltage decay under the open-circuit condition and found that the charge recombination lifetime ($\tau_r$) of the device on TiO$_2$—Cl was substantially longer than that of the device on TiO$_2$ (145 μs versus 64 μs; FIG. 15D), consistent with slowed charge recombination at the TiO$_2$—Cl/perovskite interface. The reduced ideality factor of solar cells with TiO$_2$—Cl (n=1.25) compared to TiO$_2$ (n=1.73) is consistent with suppressed interfacial recombination (FIG. 19). As seen in the DFT studies, interfacial Cl atoms suppress the formation of deep trap states on the surface of perovskite films, leading to improved surface passivation and reduced interfacial recombination.

Figure 15E:
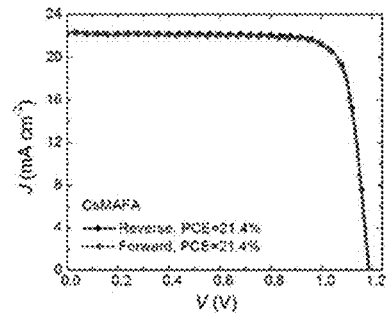
Figure 15F:
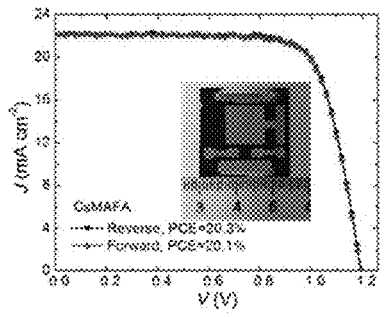

To examine the applicability of TiO$_2$—Cl to other high-efficiency PSCs, devices were fabricated using cesium-containing perovskite Cs$_{0.05}$FA$_{0.81}$MA$_{0.14}$PbI$_{2.55}$Br$_{0.45}$ (denoted as CsMAFA), which had been shown to improve performance and photostability compared to FA$_{0.85}$MA$_{0.15}$PbI$_{2.55}$Br$_{0.45}$ (denoted as MAFA) (5). The best-performing small-area CsMAFA solar cell (0.049 cm$^2$) exhibited a high laboratory PCE of 21.4% (V$_{oc}$=1.189 V, J$_{sc}$=22.3 mA/cm$^2$, FF=0.806) without hysteresis in J-V sweeps (FIG. 15E). We also fabricated large-area (1.1 cm$^2$) CsMAFA solar cells on TiO$_2$—Cl, showing a PCE value >20% with negligible hysteresis (FIG. 15F). A small-area and a large-area device were sent, without encapsulation, to an accredited independent PV test laboratory (Newport Corporation PV Lab, Mont., USA) for certification. They gave certified PCEs of 20.1% and 19.5%, respectively. The large-area device exhibited ~3% performance loss relative to the small-area device.

The long-term stability of low-temperature planar PSCs made on TiO$_2$—Cl and TiO$_2$ under dark storage as well as under operating conditions were examined. The long-term stability of PSCs is closely related to the front ETL/perovskite interface binding strength and interfacial charge accumulation during operation. The devices made on TiO$_2$—Cl showed substantially enhanced stability relative to TiO$_2$ under dark storage (FIG. 20A). MAFA based devices on TiO$_2$—Cl maintained 95% of their initial PCE after storage in the dark over 60 days, while those on TiO$_2$ only retained 38% of their initial efficiency. The high-efficiency CsMAFA devices on TiO$_2$—Cl (initial PCE >21%) exhibited promising shelf stability, retaining 96% of their initial performance after 90 days (over 2,000 hours).

Figure 21:
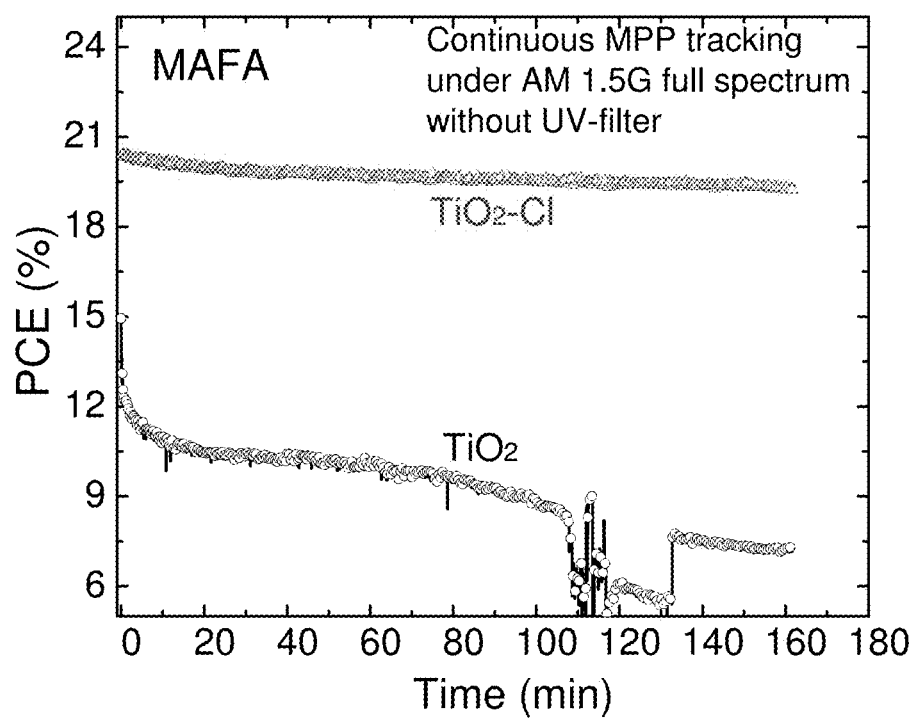
FIG. 21 is a plot of solar cell power conversion efficiency versus operation time of unsealed MAFA perovskite solar cells deposited on $TiO_2$ and $TiO_2$—Cl electron transport layers under continuous one-sun full light illumination (AM 1.5G; 100 mW cm$^{-2}$) without UV-filter. The cells were operating at maximal power point continuously under nitrogen.
Figure 22:
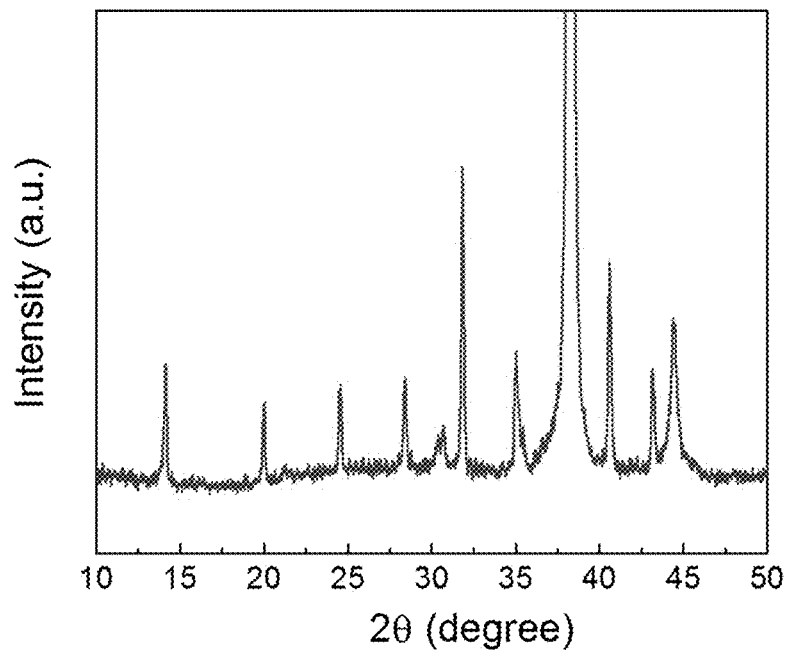
FIG. 22 shows XRD pattern of CsMAFA perovskite solar cell after 500-hour MPP operation measured from the Au electrode side. Neither yellow-phase nor $PbI_2$ phase was observed.

Solar cells must operate stably under maximum power point (MPP) conditions. The MAFA solar cells based on TiO$_2$—Cl showed improved stability under continuous operation at MPP compared to devices based on TiO$_2$ (FIG. 21). Impressively, the CsMAFA solar cell on TiO$_2$—Cl (with 420-nm cutoff UV filter) retained 90% of their initial performance after continuous operation for 500 hours under one-sun illumination, as directly determined from the MPP tracking (FIG. 20B). The PCE increased slightly in the first tens of hours of MPP operation, which may be caused by light-induced defect healing in the perovskite active layer. No perovskite decomposition was observed after MPP operation as seen from XRD (FIG. 22), indicating that the performance drop during MPP operation may be caused by defect generation in the perovskite layer and changes to the perovskite/Spiro-OMeTAD interface (the latter has previously been shown to be vulnerable). The device self-recovered to an efficiency of 19.8% (97% of initial PCE) following dark storage (FIG. 20C), consistent with previous reports.

Overall, the stronger binding at the TiO$_2$—Cl/perovskite interface and the suppressed interfacial recombination account for superior stability in planar PSCs based on TiO$_2$—Cl. The new approach to fabricate efficient and stable perovskite solar cells is simple and scalable, compatible with future industrialization of perovskite-based PV technology. It offers a promising path to flexible devices and to combining with low-band-gap semiconductor materials to form tandem devices.

In this non-limiting example, the electron transport layer is formed from TiO$_2$ nanocrystals and the ligand is Cl$^-$, and the perovskite is MA$_{0.15}$FA$_{0.85}$PbI$_{2.55}$Br$_{0.45}$, wherein MA is methylammonium cation and FA is formamidinium cation.

The present disclosure provides a method of producing perovskite based optoelectronic devices made entirely via solution-processing at low temperatures (<150° C.) which provide for simple manufacturing, compatibility with flexible substrates, and perovskite-based tandem devices. The method involves depositing a semiconductor electron transport layer on an optically transparent electrode via solution-processing in which the top surface of the electron transport layer is capped with ligands. This semiconductor electron transport layer may be produced using metal or metal oxide nanocrystals to which the ligands have been attached to the nanocrystal surfaces via solution processing prior to being formed into a layer on the optically transparent electrode, for example by spin coating (but many other techniques may be used). The perovskite layer is then deposited using solution-processing and after it is deposited a hole transport layer is deposited on the perovskite layer using solution processing. An electrode is then formed on the hole transport layer using solution processing to produce the perovskite based optoelectronic device.

These perovskite based optoelectronic devices are produced using an electron transport layer on which the perovskite layer is formed which is passivated using a ligand selected to reduce electron-hole recombination at the interface between the electron transport layer and the perovskite layer.

The foregoing description of the preferred embodiments of perovskite optoelectronic devices in which the interface or junction between the light absorbing perovskite layer and the electron transport layer is passivated has been presented to illustrate the principles of the invention and not to limit the invention to the particular-embodiment illustrated. It is intended that the scope of the invention be defined by all of the embodiments encompassed within the following claims and their equivalents.

REFERENCES

1. M. Niederberger, M. H. Bartl, G. D. Stucky. Benzyl Alcohol and Titanium TetrachlorideA Versatile Reaction System for the Nonaqueous and Low-Temperature Preparation of Crystalline and Luminescent Titania Nanoparticles. *Chem. Mater.* 14, 4364-4370 (2002).
2. J. Wang, J. Polleux, J. Lim, B. Dunn. Pseudocapacitive Contributions to Electrochemical Energy Storage in TiO2 (Anatase) Nanoparticles. *J. Phys. Chem. C.* 111, 14925-14931 (2007).
3. H. Zhou, Q. Chen, G. Li, S. Luo, T. Song, H. Duan, Z. Hong, J. You, Y. Liu, Y. Yang. Interface engineering of highly efficient perovskite solar cells. *Science* 345, 542-546 (2014).
4. K. Wojciechowski, M. Saliba, T. Leijtens, A. Abate, H. J. Snaith. Sub-150° C. processed meso-superstructured perovskite solar cells with enhanced efficiency. *Energy Environ. Sci.* 7, 1142-1147 (2014).
5. M. Saliba, T. Matsui, J. Seo, K. Domanski, J. Correa-Baena, M. Nazeeruddin, S. Zakeeruddin, W. Tress, A. Abate, A. Hagfeldt, M. Graetzel. Cesium-containing triple cation perovskite solar cells: improved stability, reproducibility and high efficiency. *Energy Environ. Sci.* 9, 1989-1997 (2016).

Therefore what is claimed is:

1. A perovskite-based optoelectronic device, comprising:
   a) an optically transparent electrode;
   b) a semiconductor electron transport layer on said optically transparent electrode;
   c) a light-absorbing perovskite layer formed on said semiconductor electron transport layer;
   d) the electron transport layer having a surface located at an interface or junction between the semiconductor electron transport layer and the light-absorbing perovskite layer at least partially capped with a ligand Z, wherein said ligand Z is selected to passivate surface states at said interface or junction between the semiconductor electron transport layer and the light-absorbing perovskite layer; and
   e) a hole transport layer on said light-absorbing perovskite layer, and including an electrode layer located on said hole transport layer.

2. The perovskite-based optoelectronic device according to claim 1, wherein the ligand Z is any one of a halide, a pseudo halide, a monovalent ammonium cation, and any combination thereof.

3. The perovskite-based optoelectronic device according to claim 2, wherein the halide is any one of Cl, Br, I, F, and any combination thereof.

4. The perovskite-based optoelectronic device according to claim 2, wherein the pseudo halide is a polyatomic analogue of halide ions.

5. The perovskite-based optoelectronic device according to claim 4 wherein the pseudo halide is any one of cyanide (CN), thiocyanate (SCN), cyanate (OCN), and any combination thereof.

6. The perovskite-based optoelectronic device according to claim 2, wherein the monovalent ammonium cation is any one of positively charged polyatomic ions with the chemical formula of R1R2R3R4N+; where R1, R2, R3, R4 are selected from a group consisting of hydrogen, and compounds derived from linear alkanes, branched alkanes, cycloalkanes, (poly)cycloalkanes, cis- and trans-linear alkenes, cis- and transbranched alkenes, linear alkynes, branched alkynes, (poly)alkynes, aromatic hydrocarbons, (poly)aromatic hydrocarbons, heteroarenes, (poly)heteroarenes, thiophenes, (poly)thiophenes, (poly)anilines, and combination of above mentioned elements.

7. The perovskite-based optoelectronic device according to claim 1, wherein the semiconductor electron transport layer is any one of doped or undoped $TiO_2$, $SnO_2$, $Al_2O_3$, $Ga_2O_3$, ZnO, $Zn_2SnO_4$, $BaSnO_3$, $BaTiO_3$, $Nb_2O_5$, $Ta_2O_5$ and $ZrO_2$.

8. The perovskite-based optoelectronic device according to claim 7, wherein said the semiconductor electron transport layer is planar or mesoporous.

9. The perovskite-based optoelectronic device according to claim 7, wherein said semiconductor electron transport layer comprises a single layer or multilayers.

10. The perovskite-based optoelectronic device according to claim 1, wherein said optically transparent electrode is any one of indium doped tin oxide (ITO, In2O3:SnO2), fluorine doped tin oxide (FTO, $SnO_2$:F), aluminum-doped zinc oxide (AZO), gallium-doped zinc oxide (GZO), boron-doped zinc oxide (BZO), indium-doped zinc oxide (IZO).

11. The perovskite-based optoelectronic device according to claim 1, wherein said optically transparent electrode is a film comprised of any one of silver nanowires, silver nanoparticles, carbon black, carbon nanotube, carbon nanowire, graphene, reduced graphene oxide and ultrathin graphite.

12. The perovskite-based optoelectronic device according to claim 1, wherein said hole transport layer is any one of an organic hole transport material and an inorganic hole transport material.

13. The perovskite-based optoelectronic device according to claim 12 wherein said inorganic hole transport material is any one of doped or undoped NiOx, WOx, MoOx, CuSCN, $V_2O_5$, $MoS_2$, $CuGaO_2$, PbS and any combination thereof.

14. The perovskite-based optoelectronic device according to claim 12 wherein said organic hole transport material is any one of doped or undoped Spiro-OMeTAD (N2,N2,N2',N2',N7,N7,N7',N7'-octakis(4-methoxyphenyl)-9,9'-spirobi[9Hfluorene]-2,2',7,7'-tetramine), PTAA (Poly[bis(4-phenyl)(2,4,6-trimethylphenyl)amine], P3HT (Poly(3-hexylthiophene-2,5-diyl)), Poly-TPD (Poly(N,N'-bis-4-butylphenyl-N,N'-bisphenyl)benzidine) and PEDOT:PSS (poly(3,4-ethylenedioxythiophene) polystyrene sulfonate).

15. The perovskite-based optoelectronic device according to claim 1, wherein the perovskite has a general formula of ABX3, where
   A is a monovalent cation or ion combination, wherein the monovalent cation is K+, Rb+, Cs+, or any of organic monovalent cations with the general formula of R1R2R3R4N+; where R is selected from a group consisting of hydrogen, and compounds derived from linear alkanes, branched alkanes, cycloalkanes, (poly)cycloalkanes, cis and trans-linear alkenes, cis- and trans-branched alkenes, linear alkynes, branched alkynes, (poly)alkynes, aromatic hydrocarbons, (poly)aromatic hydrocarbons, heteroarenes, (poly)heteroarenes, thiophenes, (poly)thiophenes, (poly)anilines;
   B is a divalent metal ion or ion combination, wherein the divalent cation is any of $Pb^{2+}$, $Sn^{2+}$, $Cu^{2+}$, $Ge^{2+}$, $Zn^{2+}$, $Ni^{2+}$, $Fe^{2+}$, $Mn^{2+}$, $Eu^{2+}$, and $Co^{2+}$; and any combination thereof; and
   X is any one of a halide, a pseudo halide, and any combination thereof.

16. The perovskite-based optoelectronic device according to claim 15 wherein the halide is any one or combination of Cl-, Br-, I- and F.

17. The perovskite-based optoelectronic device according to claim 15 wherein the pseudo halide is any one or combination of cyanide (CN), thiocyanate (SCN) and cyanate (OCN).

18. The perovskite-based optoelectronic device according to claim 1, wherein said semiconductor electron transport layer having the surface located at the interface or junction between the electron transport layer and the light-absorbing perovskite layer is fully capped by said ligand Z.

19. The perovskite-based optoelectronic device according to claim 1, wherein said semiconductor electron transport layer is formed from TiO2 nanocrystals, wherein said ligand is Cl-, and wherein said perovskite is MA0.15FA0.85PbI2.55Br0.45, wherein MA is methylammonium cation and FA is formamidinium cation.

20. The perovskite-based optoelectronic device according to claim 1, wherein said electron transport layer has a thickness in a range from about 5 nm to about 300 nm, and wherein said hole transport layer has a thickness in a range from about 10 nm to about 300 nm, and wherein said light absorbing perovskite layer a thickness in a range from about 20 nm to about 2000 nm.

* * * * *